United States Patent
Rapp et al.

(10) Patent No.: US 8,073,974 B2
(45) Date of Patent: Dec. 6, 2011

(54) OBJECT ORIENTED MISSION FRAMEWORK AND SYSTEM AND METHOD

(75) Inventors: John Rapp, Manassas, VA (US);
Chandan Mathur, Keller, TX (US);
Kenneth Schulz, Bristow, VA (US);
Andrew Hamm, Herndon, VA (US)

(73) Assignee: Lockheed Martin Corporation, Bethesda, MD (US)

(*) Notice: Subject to any disclaimer, the term of this patent is extended or adjusted under 35 U.S.C. 154(b) by 1128 days.

(21) Appl. No.: 11/243,502

(22) Filed: Oct. 3, 2005

(65) Prior Publication Data

US 2006/0149920 A1 Jul. 6, 2006

Related U.S. Application Data

(60) Provisional application No. 60/615,192, filed on Oct. 1, 2004, provisional application No. 60/615,157, filed on Oct. 1, 2004, provisional application No. 60/615,170, filed on Oct. 1, 2004, provisional application No. 60/615,158, filed on Oct. 1, 2004, provisional application No. 60/615,193, filed on Oct. 1, 2004, provisional application No. 60/615,050, filed on Oct. 1, 2004.

(51) Int. Cl.
*G06F 15/16* (2006.01)
*G06F 13/38* (2006.01)
(52) U.S. Cl. .............. 709/247; 710/69; 710/72
(58) Field of Classification Search .......... 709/201, 709/247; 710/69, 72
See application file for complete search history.

(56) References Cited

U.S. PATENT DOCUMENTS

| | | | |
|---|---|---|---|
| 3,665,173 A | 5/1972 | Bouricius et al. |
| 4,703,475 A | 10/1987 | Dretzka et al. |
| 4,774,574 A | 9/1988 | Daly et al. |
| 4,782,461 A | 11/1988 | Mick et al. |
| 4,862,407 A | 8/1989 | Fette et al. |
| 4,873,626 A | 10/1989 | Gifford |
| 4,914,653 A | 4/1990 | Bishop et al. |
| 4,956,771 A | 9/1990 | Neustaedter |
| 4,985,832 A | 1/1991 | Grondalski |
| 5,185,871 A | 2/1993 | Frey et al. |
| 5,283,883 A | 2/1994 | Mishler |
| 5,317,752 A | 5/1994 | Jewett et al. |
| 5,339,413 A | 8/1994 | Koval et al. |
| 5,361,373 A | 11/1994 | Gilson |

(Continued)

FOREIGN PATENT DOCUMENTS

AU 2003287317 6/2004

(Continued)

OTHER PUBLICATIONS

Serialization API, Jul. 2000, [online], [retrieved on Jun. 18, 2009]. Retrieved from the Internet <java.sun.com/developer/technicalArticles/Programming/serialization/>, pp. 1-7 as printed.*

(Continued)

*Primary Examiner* — Philip J. Chea
*Assistant Examiner* — Michael Chao
(74) *Attorney, Agent, or Firm* — Mark A. Wurm; Paul F. Rusyn; Graybeal Jackson LLP

(57) ABSTRACT

A mission system includes a peer vector machine having a host processor and pipeline accelerator and including bridge objects that provide communication via signal objects, message objects, and mission objects.

9 Claims, 16 Drawing Sheets

U.S. PATENT DOCUMENTS

| | | |
|---|---|---|
| 5,371,896 A | 12/1994 | Gove et al. |
| 5,377,333 A | 12/1994 | Nakagoshi et al. |
| 5,421,028 A | 5/1995 | Swanson |
| 5,440,682 A | 8/1995 | Deering |
| 5,524,075 A | 6/1996 | Rousseau et al. |
| 5,544,067 A | 8/1996 | Rostoker et al. |
| 5,583,964 A | 12/1996 | Wang |
| 5,623,418 A | 4/1997 | Rostoker et al. |
| 5,640,107 A | 6/1997 | Kruse |
| 5,648,732 A | 7/1997 | Duncan |
| 5,649,135 A | 7/1997 | Pechanek et al. |
| 5,655,069 A | 8/1997 | Ogawara et al. |
| 5,694,371 A | 12/1997 | Kawaguchi |
| 5,710,910 A | 1/1998 | Kehl et al. |
| 5,712,922 A | 1/1998 | Loewenthal et al. |
| 5,732,107 A | 3/1998 | Phillips et al. |
| 5,752,071 A | 5/1998 | Tubbs et al. |
| 5,784,636 A | 7/1998 | Rupp |
| 5,801,958 A | 9/1998 | Dangelo et al. |
| 5,867,399 A | 2/1999 | Rostoker et al. |
| 5,892,962 A | 4/1999 | Cloutier |
| 5,909,565 A | 6/1999 | Morikawa et al. |
| 5,910,897 A | 6/1999 | Dangelo et al. |
| 5,916,307 A | 6/1999 | Piskiel et al. |
| 5,930,147 A | 7/1999 | Takei |
| 5,931,959 A | 8/1999 | Kwiat |
| 5,933,356 A | 8/1999 | Rostoker et al. |
| 5,941,999 A | 8/1999 | Matena et al. |
| 5,963,454 A | 10/1999 | Dockser et al. |
| 5,978,578 A * | 11/1999 | Azarya et al. ............... 717/100 |
| 5,987,620 A | 11/1999 | Tran |
| 5,996,059 A | 11/1999 | Porten et al. |
| 6,009,531 A | 12/1999 | Selvidge et al. |
| 6,018,793 A | 1/2000 | Rao |
| 6,023,742 A | 2/2000 | Ebeling et al. |
| 6,028,939 A | 2/2000 | Yin |
| 6,049,222 A | 4/2000 | Lawman |
| 6,096,091 A | 8/2000 | Hartmann |
| 6,108,693 A | 8/2000 | Tamura |
| 6,112,288 A | 8/2000 | Ullner |
| 6,115,047 A | 9/2000 | Deering |
| 6,128,755 A | 10/2000 | Bello et al. |
| 6,192,384 B1 | 2/2001 | Dally et al. |
| 6,202,139 B1 | 3/2001 | Witt et al. |
| 6,205,516 B1 | 3/2001 | Usami |
| 6,216,191 B1 | 4/2001 | Britton et al. |
| 6,216,252 B1 | 4/2001 | Dangelo et al. |
| 6,237,054 B1 | 5/2001 | Freitag, Jr. |
| 6,247,118 B1 | 6/2001 | Zumkehr et al. |
| 6,247,134 B1 | 6/2001 | Sproch et al. |
| 6,253,276 B1 | 6/2001 | Jeddeloh |
| 6,282,578 B1 | 8/2001 | Aizono et al. |
| 6,282,627 B1 | 8/2001 | Wong et al. |
| 6,308,311 B1 | 10/2001 | Carmichael et al. |
| 6,324,678 B1 | 11/2001 | Dangelo et al. |
| 6,326,806 B1 | 12/2001 | Fallside et al. |
| 6,363,465 B1 | 3/2002 | Toda |
| 6,470,482 B1 | 10/2002 | Rostoker et al. |
| 6,477,170 B1 | 11/2002 | Lu et al. |
| 6,516,420 B1 | 2/2003 | Audityan et al. |
| 6,526,430 B1 | 2/2003 | Hung et al. |
| 6,532,009 B1 | 3/2003 | Fox et al. |
| 6,606,360 B1 | 8/2003 | Dunning et al. |
| 6,611,920 B1 | 8/2003 | Fletcher et al. |
| 6,624,819 B1 | 9/2003 | Lewis |
| 6,625,749 B1 | 9/2003 | Quach |
| 6,662,285 B1 | 12/2003 | Douglass et al. |
| 6,684,314 B1 | 1/2004 | Manter |
| 6,704,816 B1 | 3/2004 | Burke |
| 6,708,239 B1 * | 3/2004 | Ellerbrock et al. ............ 710/62 |
| 6,769,072 B1 | 7/2004 | Kawamura et al. |
| 6,785,841 B2 | 8/2004 | Akrout et al. |
| 6,785,842 B2 | 8/2004 | Zumkehr et al. |
| 6,829,697 B1 | 12/2004 | Davis et al. |
| 6,839,873 B1 | 1/2005 | Moore |
| 6,915,502 B2 | 7/2005 | Schott et al. |
| 6,925,549 B2 | 8/2005 | Cook et al. |
| 6,982,976 B2 | 1/2006 | Galicki et al. |
| 6,985,975 B1 | 1/2006 | Chamdani et al. |
| 7,000,213 B2 | 2/2006 | Banerjee et al. |
| 7,024,654 B2 | 4/2006 | Bersch et al. |
| 7,036,059 B1 | 4/2006 | Carmichael et al. |
| 7,073,158 B2 | 7/2006 | McCubbrey |
| 7,117,390 B1 | 10/2006 | Klarer et al. |
| 7,134,047 B2 | 11/2006 | Quach |
| 7,137,020 B2 | 11/2006 | Gilstrap et al. |
| 7,143,302 B2 | 11/2006 | Pappalardo et al. |
| 7,143,418 B1 | 11/2006 | Patterson |
| 7,177,310 B2 | 2/2007 | Inagaki et al. |
| 7,200,114 B1 | 4/2007 | Tse-Au |
| 7,228,520 B1 | 6/2007 | Keller et al. |
| 7,260,794 B2 | 8/2007 | Butts |
| 7,284,225 B1 | 10/2007 | Ballagh et al. |
| 7,373,432 B2 | 5/2008 | Rapp et al. |
| 7,386,704 B2 | 6/2008 | Schulz et al. |
| 7,404,170 B2 | 7/2008 | Schott et al. |
| 7,418,574 B2 | 8/2008 | Mathur et al. |
| 7,487,302 B2 | 2/2009 | Gouldey et al. |
| 2001/0014937 A1 | 8/2001 | Huppenthal et al. |
| 2001/0025338 A1 | 9/2001 | Zumkehr et al. |
| 2001/0047509 A1 | 11/2001 | Mason et al. |
| 2002/0041685 A1 | 4/2002 | McLoone et al. |
| 2002/0066910 A1 | 6/2002 | Tamemoto et al. |
| 2002/0087829 A1 | 7/2002 | Snyder et al. |
| 2002/0120883 A1 | 8/2002 | Cook et al. |
| 2002/0144175 A1 | 10/2002 | Long et al. |
| 2002/0162086 A1 | 10/2002 | Morgan |
| 2003/0009651 A1 | 1/2003 | Najam et al. |
| 2003/0014627 A1 | 1/2003 | Krishna et al. |
| 2003/0061409 A1 | 3/2003 | RuDusky |
| 2003/0115500 A1 | 6/2003 | Akrout et al. |
| 2003/0177223 A1 | 9/2003 | Erickson et al. |
| 2003/0229877 A1 | 12/2003 | Bersch et al. |
| 2003/0231649 A1 | 12/2003 | Awoseyi et al. |
| 2004/0019771 A1 | 1/2004 | Quach |
| 2004/0019883 A1 | 1/2004 | Banerjee et al. |
| 2004/0044915 A1 | 3/2004 | Bose et al. |
| 2004/0045015 A1 | 3/2004 | Haji-Aghajani et al. |
| 2004/0061147 A1 | 4/2004 | Fujita et al. |
| 2004/0064198 A1 | 4/2004 | Reynolds et al. |
| 2004/0130927 A1 | 7/2004 | Schulz et al. |
| 2004/0133763 A1 | 7/2004 | Manthur et al. |
| 2004/0136241 A1 | 7/2004 | Rapp et al. |
| 2004/0153752 A1 | 8/2004 | Sutardja et al. |
| 2004/0170070 A1 | 9/2004 | Rapp et al. |
| 2004/0181621 A1 | 9/2004 | Manthur et al. |
| 2005/0104743 A1 | 5/2005 | Ripolone et al. |
| 2005/0149898 A1 | 7/2005 | Hakewill et al. |
| 2006/0085781 A1 | 4/2006 | Rapp et al. |
| 2006/0087450 A1 | 4/2006 | Schultz et al. |
| 2006/0101250 A1 | 5/2006 | Rapp et al. |
| 2006/0101253 A1 | 5/2006 | Rapp et al. |
| 2006/0101307 A1 | 5/2006 | Rapp et al. |
| 2006/0123282 A1 | 6/2006 | Gouldey et al. |
| 2006/0152087 A1 | 7/2006 | De Oliverira Kastrup Pereira et al. |
| 2006/0206850 A1 | 9/2006 | McCubbrey |
| 2006/0230377 A1 | 10/2006 | Rapp et al. |
| 2006/0236018 A1 | 10/2006 | Dao et al. |
| 2007/0055907 A1 | 3/2007 | Sutardja et al. |
| 2007/0271545 A1 | 11/2007 | Eng |
| 2008/0222337 A1 | 9/2008 | Schulz et al. |

FOREIGN PATENT DOCUMENTS

| | | |
|---|---|---|
| AU | 2003287318 | 6/2004 |
| AU | 2003287319 | 6/2004 |
| AU | 2003287320 | 6/2004 |
| AU | 2003287321 | 6/2004 |
| CA | 2503611 | 5/2004 |
| CA | 2503613 | 5/2004 |
| CA | 2503617 | 5/2004 |
| CA | 2503620 | 5/2004 |
| CA | 2503622 | 5/2004 |
| EP | 0694847 | 1/1996 |
| EP | 0945788 | 9/1999 |
| EP | 0161438 | 12/2000 |
| EP | 1061439 | 12/2000 |

| | | |
|---|---|---|
| EP | 0945788 | 8/2004 |
| EP | 1559005 | 8/2005 |
| EP | 1570344 | 9/2005 |
| EP | 1573514 | 9/2005 |
| EP | 1573515 | 9/2005 |
| EP | 1576471 | 9/2005 |
| JP | 63-234343 A | 9/1988 |
| JP | 5108347 | 4/1993 |
| JP | 6282432 | 10/1994 |
| JP | 9097204 A | 4/1997 |
| JP | 2001-236496 | 8/2001 |
| JP | 2002-132489 A | 5/2002 |
| JP | 2002-149424 | 5/2002 |
| JP | 2002-269063 A | 9/2002 |
| JP | 2002-281079 A | 9/2002 |
| JP | 2006515941 | 6/2006 |
| JP | 2006518056 | 8/2006 |
| JP | 2006518057 | 8/2006 |
| JP | 2006518058 | 8/2006 |
| JP | 2006518495 | 8/2006 |
| KR | 20050084628 | 8/2005 |
| KR | 20050084629 | 8/2005 |
| KR | 20050086423 | 8/2005 |
| KR | 20050086424 | 8/2005 |
| KR | 20050088995 | 9/2005 |
| TW | 470914 | 1/2002 |
| TW | 497074 | 8/2002 |
| TW | 200416594 | 9/2004 |
| WO | WO 2004042560 | 5/2004 |
| WO | WO 2004042561 | 5/2004 |
| WO | WO 2004042562 | 5/2004 |
| WO | WO 2004042569 | 5/2004 |
| WO | WO 2004042574 | 5/2004 |
| WO | WO 2006/039711 | 4/2006 |
| WO | WO 2006/039713 | 4/2006 |
| WO | WO 2006039710 | 4/2006 |

OTHER PUBLICATIONS

Wollrath, 1996, [online], [retrieved on Jun. 18, 2009]. Retrieved from the Internet<usenix.org/publications/library/proceedings/coots96/wollrath.html> pp. 1-14 as printed.*
Filipov, andree, Application of Reconfigurable Computing to Acoustic Sensors, Oct. 2000, U.S. Army Reserach Laboratory, retrieved from the Internet <e.g. URL: stormingmedia.us/61/6122/A612293.html> pp. 1-16 as printed.*
Free Online Dictionary of Computing (1997) Definitions of "FPGA" and "raw data"; http://foldoc.org.
Hansen (1977) The Architecture of Concurrent Programs; Prentice Hall, Inc.; pp. 16-17, 19-20, 24-27, 47-54, 72-73, 151-152.
Microsoft (1999) Microsoft Computer Dictionary, $4^{th}$ Edition; Microsoft Press; p. 215.
Microsoft (2002) Microsoft Computer Dictionary, $5^{th}$ Edition; Microsoft Press; pp. 77-78.
Patterson (1996) Computer Architecture, A Quantitative Approach, $2^{nd}$ Edition; Morgan Kauffman; pp. 134, 155.
"Chips: New Accelerator Chip From Hi/fn to Speed-Up Virtual Private Networks—"VPNs"—Product Announcement", Edge Publishing, On & About AT&T, Oct. 26, 2008, http://findarticles.com/p/articles/mi_m0UNZ/is_1998_Oct_26/ai_53126574, 2 pages.
Lisa Wu, Chris Weaver, and Todd Austin, "CryptoManiac: A Fast Flexible Architecture for Secure Communication", IEEE 2001, 10 pages.
International Search Report for PCT/US2005/035818 dated Aug. 4, 2006.
International Search Report for PCT/US2005/035813.
International Search Report for PCT/US2005/035814 dated Feb. 23, 2006.
Bakshi S; Gajski D D; "Partitioning and Pipelining for Performance-Constrained Hardware/Software Systems", IEEE Transactions on Very Large Scale Integration (VLSI) Systems, vol. 7, Nr. 4, p. 419-432, (Dec. 1999), XP000869229.
Lecurieux-Lafayette G: "Un Seul FPGA Dope Le Traitement D'Images", Electronique, CEP Communication, Paris, FR, No. 55, 1996, pp. 98, 101-103.
Salcic Z et al., "FLIX environment for generation of custom-configurable machines in FPLDs for embedded applications", Microprocessors and Microsystems, IPC Business Press Ltd. London, GB, vol. 23, No. 8-9, Dec. 15, 1999, pp. 513-526.
Vermeulen F. et al., "Flexible Hardware Acceleration for Multimedia Oriented Microprocessors", Micro-33. Proceedings of the 33rd Annual ACM/IEEE International Symposium on Microarchitecture. Monterey, CA, Dec. 10-13, 2000, Proceedings of the Annual ACM/IEEE International Symposium on Microarchitecture, Los Alamitos, CA: IEEE Comp. Soc, US, Dec. 10, 2000, pp. 171-177.
International Search Report for PCT/US 03/34557, Dec. 21, 2004.
International Search Report for PCT/US03/34558 dated Jun. 16, 2005.
International Search Report for PCT/US03/34559 dated Jan. 7, 2005.
Davis (2001) "MatLAB to RTL Synthesis"; XP002372287, Internet Archive, URL: http://web.archive.org/web/20010702232849/http://bwrc.eecs.berkeley.edu/People/Grad_Students/wrdavis/research/ee244/progress.html.
European Search Report, European Application No. EP 0694847 A3, Dated Jun. 14, 1999.
Examination Report, European Patent Application No. EP 1570344, Dated Sep. 6, 2005.
Examination Report, European Patent Application No. EP 1573515, Dated Jan. 12, 2007.
Examination Report, European Patent Application No. EP 1573514, Dated Aug. 31, 2007.
Final Office Action, U.S. Appl. No. 10/684,053, Dated Jul. 19, 2007.
Final Office Action, U.S. Appl. No. 10/684,053, Dated Nov. 5, 2008.
Final Office Action, U.S. Appl. No. 10/684,057, Dated Apr. 19, 2006.
IEEE VHDL Math Package Study Group, "Package_Math Real Version 0.7 9header only)", May 28, 1993, XP002372288, URL: http://tams-www.informatik.uni-hamburg.de/vhdl/packages/P1076.2/mathpack.vhd.
International Search Report, International Patent Application No. PCT/US2003/034555, Dated Dec. 23, 2005.
International Search Report, International Patent Application No. PCT/US2003/034556, Dated Mar. 7, 2006.
Taiwanese Search Report, Taiwanese Patent Application No. TW 092130031, Dated May 13, 2009.
Office Action, U.S. Appl. No. 10/683,932, Dated Feb. 13, 2006.
Office Action, U.S. Appl. No. 10/683,932, Dated Oct. 9, 2007.
Office Action, U.S. Appl. No. 10/684,053, Dated Oct. 19, 2006.
Office Action, U.S. Appl. No. 10/684,053, Dated Apr. 8, 2008.
Office Action, U.S. Appl. No. 10/684,053, Dated May 5, 2009.
Office Action, U.S. Appl. No. 10/684,057, Dated Nov. 14, 2005.
Office Action, U.S. Appl. No. 10/684,057, Dated Aug. 7, 2007.
Ramanathan et al. (1993) "Adaptive Feedback Techniques for Synchronized Multimedia Retrieval Over Integrated Networks"; IEEE/ACM Transactions on Networking; 1(2):246-259.
Rangan et al. (1992) "Designing an On-Demand Multimedia Service"; IEEE Communications Magazine; 56-64.
Tanenbaum (1984) "Structured Computer Organization, $2^{nd}$ Edition"; 10-12.
Vin et al. (1992) "System Support for Computer Mediated Multimedia Collaborations"; Sharing Perspectives, Toronto, CA; Oct. 31-Nov. 4, 1992; 203-209.
Korean Office Action Dated Mar. 9, 2010, for Korean Patent Application No. 10-2005-7007750 Filed Apr. 30, 2005.
European Office Action Dated Mar. 12, 2010, for European Patent Application No. EP 03781551.1 Filed Oct. 31, 2003.
United States Office Action Dated Mar. 31, 2010, for U.S. Appl. No. 12/151,116, filed May 2, 2008.
Australian Patent Office—Examiner'S Report No. 3 Dated Jul. 13, 2010, for Australian Patent Application No. 2003287320.
Gamma et al. (1977) "Design Patterns: Elements of Reusable Object-Oriented Software"; Addison Wesley Longman, Inc.; pp. viii-ix, 11. 13-14, 17-18, 97-101, 293-297, 300.
Office Action Dated Sep. 24, 2010, for U.S. Appl. No. 10/883,929, 35 Pages.
Canadian Intellectual Property Office, Office Action Dated Nov. 23, 2009, for Canadian Application No. 2,503,613 Filed May 21, 2004.

* cited by examiner

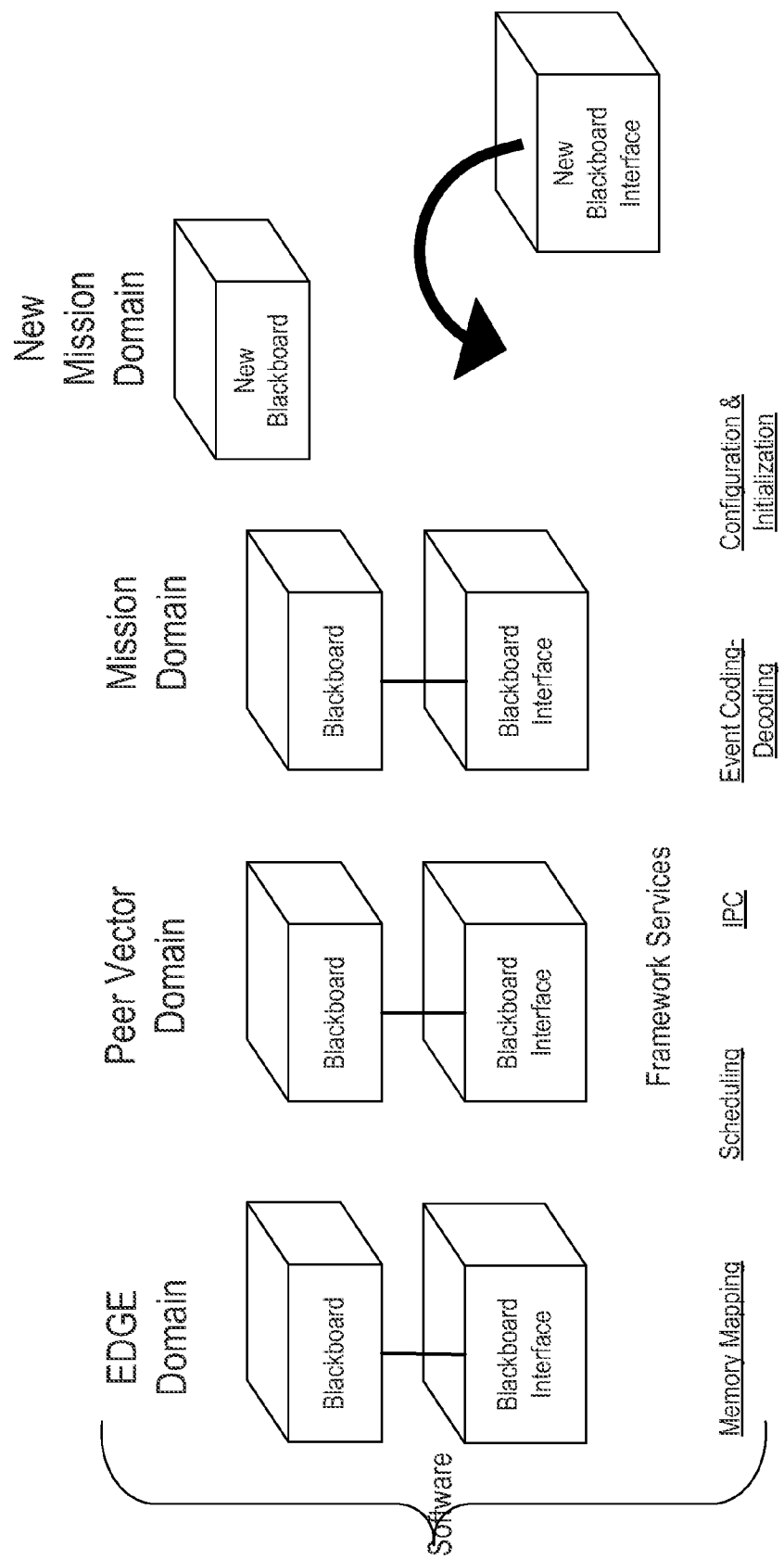

FIG. 11

| Table: Carrier Board (402) | |
|---|---|
| Host | Text |
| EnclosureID | Integer |
| CarrierBoardSlot | Integer |
| BaseAddress | Double |

| Table: Enclosure (404) | |
|---|---|
| Host | Text |
| EnclosureID | Integer |
| BusInterface | Text |

| Table: Industry Pack (406) | |
|---|---|
| Host | Text |
| EnclosureID | Integer |
| CarrierBoardSlot | Long |
| IPLocation | Text |
| ManufactererCode | Long |
| ModelCode | Long |
| GeneratesInterrupts | Y/N |
| InterruptPriorityLevel | Integer |
| InterruptVector | Long |
| ioSPaceOffset | Long |
| ioSpaceSize | Long |
| idSpaceOffset | Long |
| idSpaceSize | Integer |
| ioDirection | Integer |
| IsbPosition | Long |
| Port | Integer |
| VPI | Integer |
| VCI | Integer |
| DebounceTime | Integer |
| NumberDataRegisters | Integer |
| Description | Text |

| Table: Signal (408) | |
|---|---|
| Host | Text |
| EnclosureID | Integer |
| CarrierBoardSlot | Integer |
| IpLocation | Text |
| Channel | Long |
| EventID | Long |
| SigGeneratesInterrupts | Y/N |
| Input | Y/N |
| RequiresPolarityChange | Y/N |
| lsb | Integer |
| Width | Long |
| ParentRegister | Long |
| Scaling | Long |
| Description | Text |

OBJECT ORIENTED MISSION FRAMEWORK AND SYSTEM AND METHOD

CLAIM OF PRIORITY

The present application claims priority from U.S. provisional patent application No. 60/615,192, filed on Oct. 1, 2004; U.S. Provisional patent application No. 60/615,157, filed Oct. 1, 2004; U.S. provisional patent application No. 60/615,170 filed Oct. 1, 2004; U.S. provisional patent application No. 60/615,158 filed Oct. 1, 2004; U.S. provisional patent application No. 60/615,193 filed Oct. 1, 2004 and, U.S. provisional patent application No. 60/615,050, filed Oct. 1, 2004, which are incorporated herein by reference in their entirety and for all their teachings and disclosures.

CROSS REFERENCE TO RELATED APPLICATIONS

This application is related to U.S. patent application Ser. Nos. 10/684,102 entitled IMPROVED COMPUTING ARCHITECTURE AND RELATED SYSTEM AND METHOD, Ser. No. 10/684,053 entitled COMPUTING MACHINE HAVING IMPROVED COMPUTING ARCHITECTURE AND RELATED SYSTEM AND METHOD, Ser. No. 10/684,057 entitled PROGRAMMABLE CIRCUIT AND RELATED COMPUTING MACHINE AND METHOD, and Ser. No. 10/683,932 entitled PIPELINE ACCELERATOR HAVING MULTIPLE PIPELINE UNITS AND RELATED COMPUTING MACHINE AND METHOD, which have a common filing date and owner and which are incorporated by reference.

BACKGROUND

Certain huge systems are often called "missions," and the software that controls such systems is often referred to as a "mission framework." An example is a ship, which would be considered the main "big" system, and which includes a number of sub-systems like the fire-control subsystem, sonar subsystem, etc. The mission framework typically includes software objects that run the subsystems. In such mission frameworks there is a need for being able to modify subsystems as necessary without such modifications necessitating changes in subsystems within the mission framework that are not being modified.

SUMMARY

According to one embodiment, a mission system includes a peer vector machine having a host processor and pipeline accelerator and including blackboard bridges that provide communication via signal objects, message objects, and mission objects.

BRIEF DESCRIPTION OF THE DRAWINGS

FIG. 2C is a functional diagram illustrating the blackboard framework structure for the mission frameworks of FIGS. 1, 2A, and 2B.

FIG. 11 is a set of signal database objects or tables that specify exemplary configuration information for a signal exchange module implemented as an IP module.

DESCRIPTION

Figure 3:
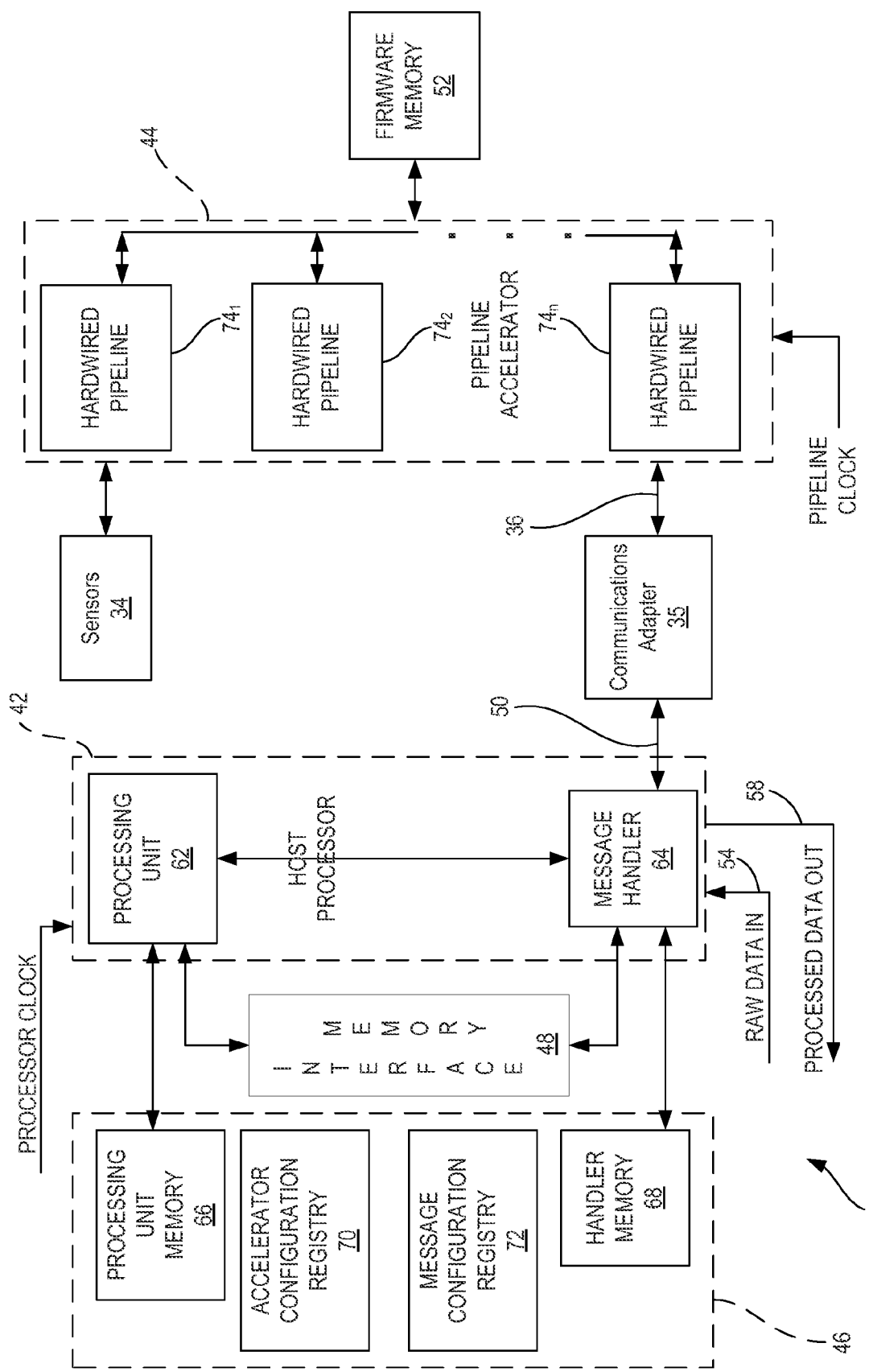
FIG. 3 is schematic block diagram of a computing machine having a peer-vector architecture according to an embodiment.
Figure 4:
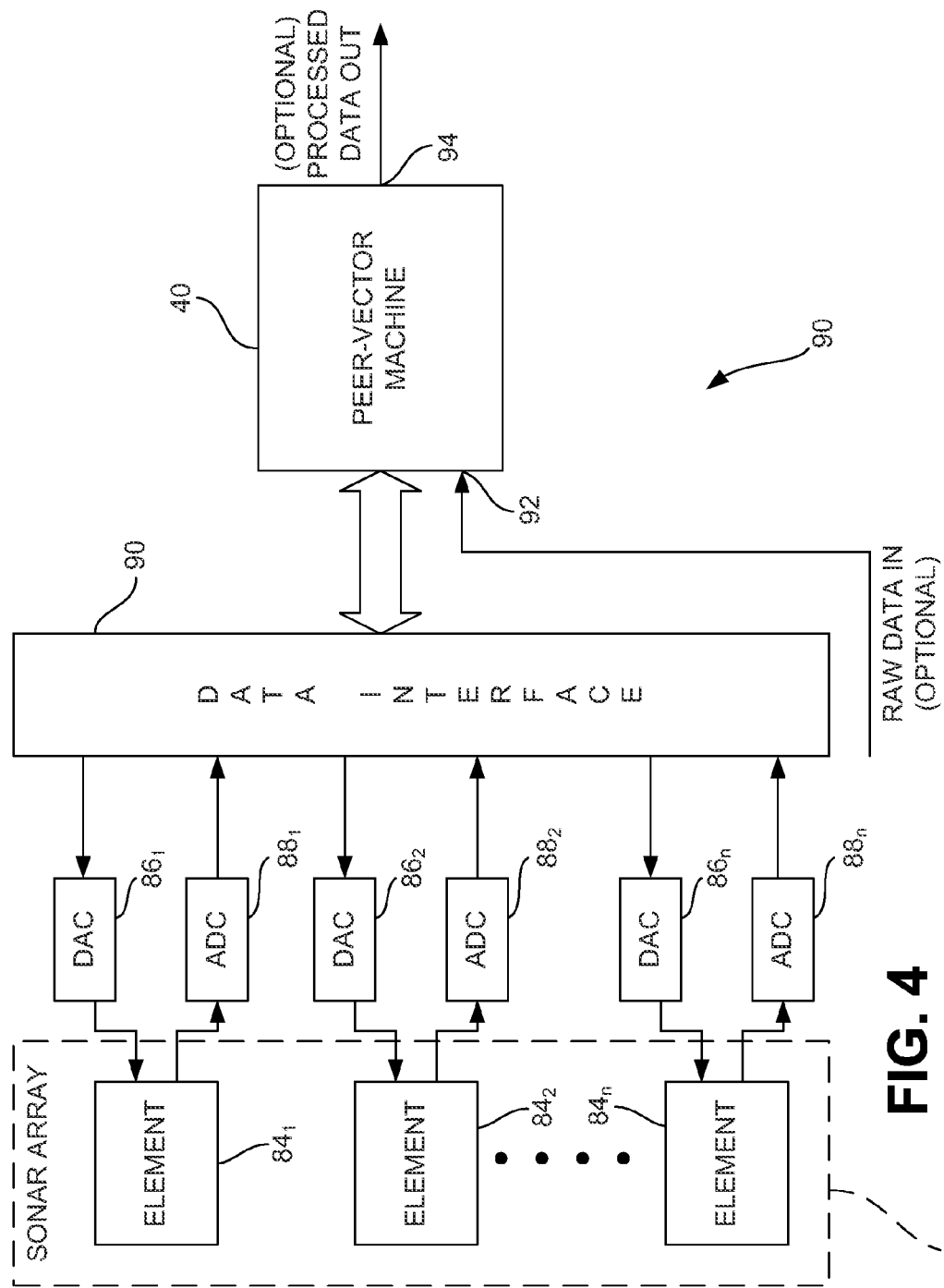
FIG. 4 is a schematic block diagram of an electronic system that incorporates the peer-vector computing machine of FIG. 3 according to an embodiment.

An embodiment is an implementation of a mission framework for a mission system using the Peer Vector Machine (PVM) as illustrated in FIGS. 3 and 4 and as will be described in more detail below. Furthermore, one can also use the edge factory techniques, which are disclosed in U.S. application Ser. No. 09/956,624, entitled OBJECT ORIENTED FRAMEWORK ARCHITECTURE FOR SENSING AND/ OR CONTROL ENVIRONMENTS where remote sensor actuators can be configured using objects and also where the edge framework is coupled to the pipeline unit side of a Peer Vector Machine as in U.S. application Ser. No. 11/243,528 entitled REMOTE SENSOR PROCESSING SYSTEM AND METHOD, filed Oct. 4, 2005, both of which are incorporated herein by reference.

Figure 1:
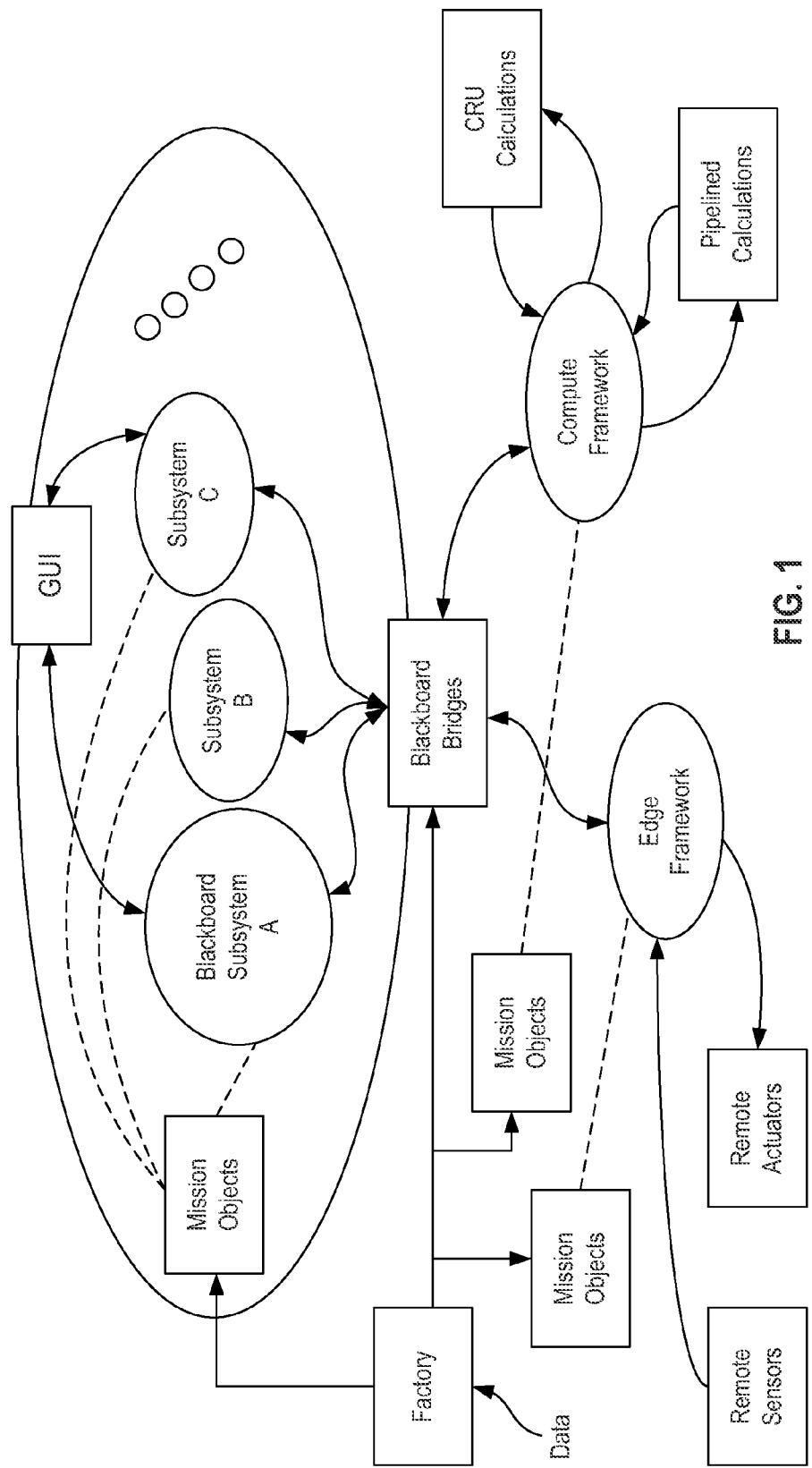
FIG. 1 is a functional diagram illustrating a general mission framework that is implemented in a peer vector machine according to one embodiment.

FIG. 1 is a functional diagram illustrating a general mission framework that is implemented in a peer vector machine (FIGS. 3 and 4) according to one embodiment. For example, as shown in FIG. 1 a number of subsystems A, B and C are encompassed in the mission. Each of these subsystems A, B, and C has access to mission objects. Each of the subsystems includes a blackboard, which is a place where an object sends messages, and other objects "subscribe" to these messages. In this way, a blackboard is like a communications interface and is in this way similar to an interface between a pipeline unit side and a host side of a peer vector machine (PVM), as will be described in more detail below (see message handler 64 discussed with reference to FIGS. 3, 4, 5D, etc. below).

Therefore, referring to the general mission framework shown in FIG. 1 there are mission objects that each of the subsystems A, B, and C can access. The subsystems A, B, and C would typically be implemented with mission object applications. Then the subsystems A, B, and C communicate with each other and to pipeline units (pipeline calculations) via blackboard bridges that can be the same as host pipeline unit interfaces in the PVM of FIGS. 3 and 4. The blackboard bridges function as the interface between the host side (see left side of FIG. 3) where the mission objects are found and the pipeline unit side (see right side of FIG. 3). There may also be a separate place for CPU calculations where the PVM would perform the CPU calculations and the pipeline unit calculations and have their interfaces to each other in the mission objects be this compute framework. These mission objects run in software to implement the different subsystems A, B, C and then through these mission objects the subsystems would off-load data calculations using message objects to the PVM which would then decide where these calculations were to occur, whether on the host side (CPU calculations) or the pipeline unit side (pipeline calculations).

Another embodiment is the "edge factory" through which the subsystems A, B, C can communicate again via signal objects with remote actuators and receive information from remote sensors and provide this information back to either the subsystem objects or to the PVM for data calculations, as will be described in more detail below. Likewise, data can be provided via the edge framework to the remote actuators. The edge framework here would use signal objects to both receive data from the remote sensors and provide data to the remote actuators. A signal object is essentially a one-way message so it is similar to a message object except it only has to be constructed for going in one direction. So the edge framework takes data from the blackboard bridges and converts it into signal objects and provides data to the blackboard bridges. Also the PVM would receive information from the blackboard bridges and then communicate internally via message objects.

Figure 2A:
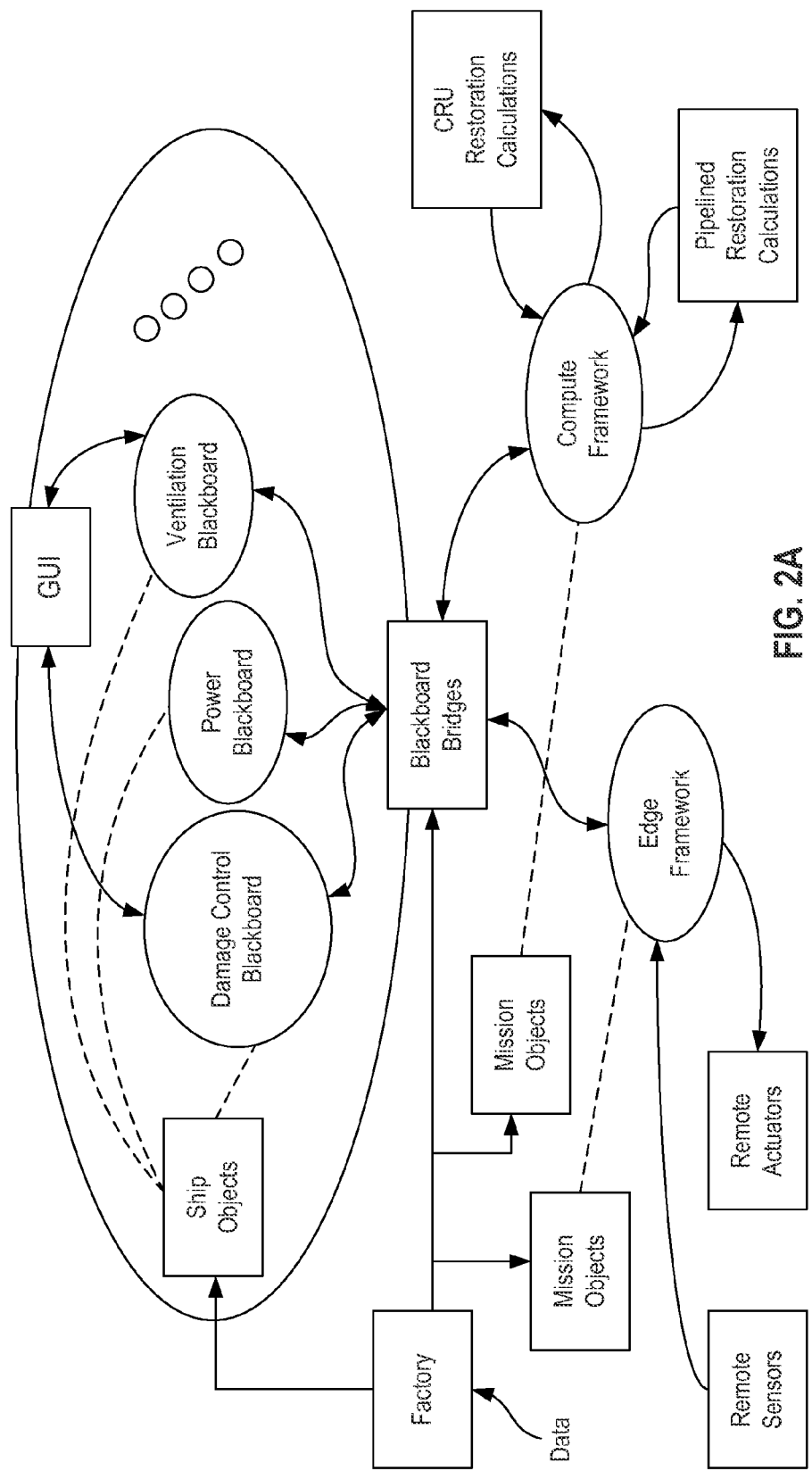
FIG. 2A is a functional diagram illustrating a ship restoration mission framework including that is implemented in a peer vector machine according to another embodiment.

In one example in the ship mission framework of FIG. 2A, the framework includes a damage control blackboard, power blackboard, and ventilation blackboard. Where one of the subsystems is the damage- or fire-control system for a ship, the remote sensors may include temperature sensors and smoke sensors to detect for fires and the remote actuators might include a shut-off valve that control different portions of the sprinkler system. If a fire were detected, not only would the system try to contain the fire where it existed by first of all sensing the fire and then turning on the sprinkler system, but it could also run a simulation to predict where the fire may go and/or what consequences the fire may have so as to minimize damage and other problems. For example, the system could try to determine where smoke would go so and would turn off portions of the ventilation system so that smoke is not blown into portions of the ship where the fire is not located. Also the framework may be used to strategically shut down portions of the ventilation system to deprive the fire of oxygen. In addition, the calculations may be used to turn on sprinkler systems in other compartments perhaps to wet things down as a preemptive strike to prevent the spread of the fire, although in some situations such preemptive actions may cause damage and thus may not be an option. A purpose of including the PVM architecture in the system such as the ship mission framework is that these predictive type calculations are very intensive, and just using a computer such calculations may not be able to be done quickly enough to be able to predict the spread of the fire to implement preemptive measures.

Figure 2B:
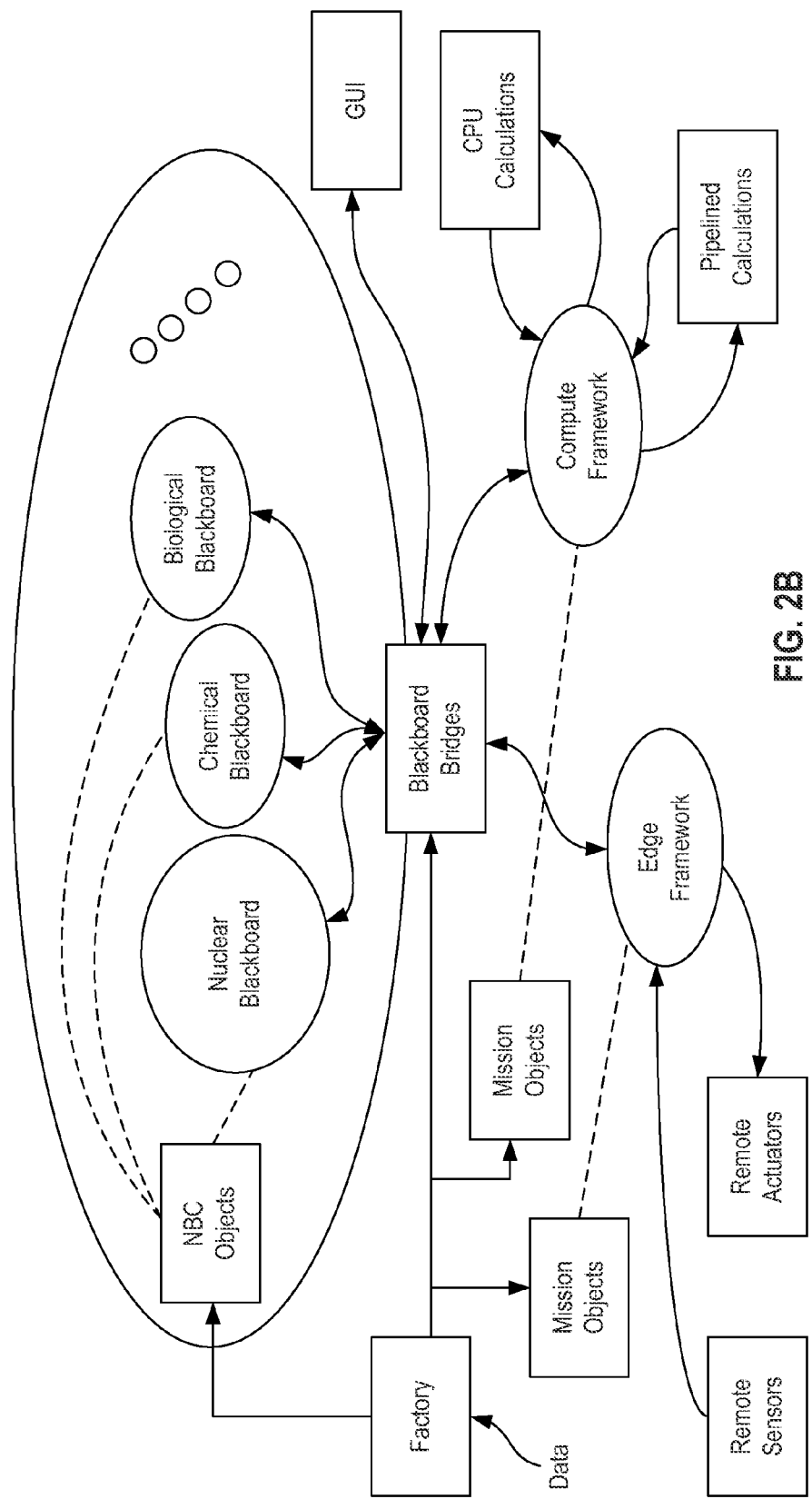
FIG. 2B is a functional diagram illustrating an anti-terrorist mission framework including that is implemented in a peer vector machine according to another embodiment.

In FIG. 2B this example mission framework is a system for responding to various types of terror attacks. In this example it could be a nuclear attack, biological attack, or chemical attack. So this system uses sensors to detect if there is such an attack and then depending on what type of attack is sensed implements some calculations and some preemptive measures through remote actuators. For example, suppose a dirty bomb exploded. Since this is a nuclear attack, the system may measure the wind patterns through various sensors located in various places throughout the area, and then run a prediction algorithm to predict where radiation may spread. This way, the proper places could be evacuated and the proper actions could be taken at the proper locations. Of course for a chemical or biological attack, the parameters would be different. For example, if a biological agent was introduced into a water supply then perhaps certain shut-offs would have to be shut-off to isolate the agent and a prediction of how far the agent has gotten into the water supply may be made. In each of the above examples, again these prediction algorithms are very intensive, so using the PVM architecture would greatly enhance the speed at which these complex algorithms could be calculated.

The Frameworks for handling signals and distributed computations have been disclosed in the prior patent applications referenced above. Embodiments integrate these two frameworks with a unique problem domain specific framework, as could be used by a business area to rapidly construct and deploy a number of different mission systems sharing this problem domain. Embodiments provide an environment to aid the construction of a mission framework for a unique problem domain.

By reusing the distributed computation framework and the remote sensing and control framework, the design of a framework for a specific problem domain or mission is greatly simplified as illustrated in FIG. 2C, which is a functional diagram illustrating the blackboard framework structure for mission frameworks such as those of FIGS. 1, 2A, and 2B. FIG. 2C also illustrates how, when a new mission domain is required, such new mission domain can be added to the framework via a corresponding new blackboard and blackboard interface/bridge without affecting the other domains.

A third framework specific to the problem domain is distinguished with this approach. Communication dependencies exist between the three frameworks, which can be specified in a new mission system design environment. A problem domain framework template would be provided for a mission system framework designer to use in customizing the problem domain framework to the desired mission.

The construction of a system of frameworks by a business area becomes less of a burden with this approach, and the frameworks become more robust, when reuse of a subsystem of frameworks is instituted. The parts of a framework system that are tailored to a mission are isolated from the parts that don't change. This reduces design complexity and lifecycle cost.

Peer-Vector Machine Architecture

The architecture of the peer vector machine (PVM) will now be described in more detail with reference to FIGS. 3 and 4. FIG. 3 is a schematic block diagram of a computing machine 40, which has a peer-vector architecture according to an embodiment. In addition to a host processor 42, the peer-vector machine 40 includes a pipeline accelerator 44, which performs at least a portion of the data processing, and which thus effectively replaces a bank of coprocessors in a conventional computing machine. Therefore, the host-processor 42 and the accelerator 44 are "peers" that can transfer data vectors back and forth. Because the accelerator 44 does not execute program instructions, it typically performs mathematically intensive operations on data significantly faster than a bank of coprocessors can for a given clock frequency. Consequently, by combing the decision-making ability of the processor 42 and the number-crunching ability of the accelerator 44, the machine 40 has the same abilities as, but can often process data faster than, a conventional computing machine such as the machine 10. Furthermore, providing the accelerator 44 with the same communication layer as the host processor 42 facilitates the design and modification of the machine 40, particularly where the communications layer is an industry standard. And where the accelerator 44 includes multiple components (e.g., PLICs), providing these components with this same communication layer facilitates the design and modification of the accelerator, particularly where the communication layer is an industry standard. Moreover, the machine 40 may also provide other advantages as described below and in the previously cited patent applications.

In addition to the host processor 42 and the pipeline accelerator 44, the peer-vector computing machine 40 includes a processor memory 46, an interface memory 48, a bus 50, a firmware memory 52, optional raw-data input ports 54 and 92 (port 92 shown in FIG. 4), optional processed-data output ports 58 and 94 (port 94 shown in FIG. 4), and an optional router 61.

The host processor 42 includes a processing unit 62 and a message handler 64, and the processor memory 46 includes a processing-unit memory 66 and a handler memory 68, which respectively serve as both program and working memories for the processor unit and the message handler. The processor memory 46 also includes an accelerator-configuration registry 70 and a message-configuration registry 72, which store respective configuration data that allow the host processor 42 to configure the functioning of the accelerator 44 and the structure of the messages that the message handler 64 generates.

The pipeline accelerator 44 is disposed on at least one PLIC (not shown) and includes hardwired pipelines $74_1$-$74_n$, which process respective data without executing program instructions. The firmware memory 52 stores the configuration firmware for the accelerator 44. If the accelerator 44 is disposed on multiple PLICs, these PLICs and their respective firmware memories may be disposed on multiple circuit boards, i.e., daughter cards (not shown). Alternatively, the accelerator 44 may be disposed on at least one ASIC, and thus may have internal interconnections that are unconfigurable. In this alternative, the machine 40 may omit the firmware memory 52. Furthermore, although the accelerator 44 is shown including multiple pipelines 74, it may include only a single pipeline.

Still referring to FIG. 3, the operation of the peer-vector machine 40 is discussed below according to an embodiment of the peer-vector machine 40.

When the peer-vector machine 40 is first activated, the processing unit 62 configures the message handler 64 and the pipeline accelerator 44 (where the accelerator is configurable) so that the machine will execute the desired algorithm. Specifically, the processing unit 62 executes a host application program that is stored in the memory 66 and that causes the processing unit to configure the message handler 64 and the accelerator 44 as discussed below.

To configure the message handler 64, the processing unit 62 retrieves message-format information from the registry 72 and provides this format information to the message handler, which stores this information in the memory 68. When the machine 40 processes data as discussed below, the message handler 64 uses this format information to generate and decipher data messages that have a desired format. In one embodiment, the format information is written in Extensible Markup Language (XML), although it can be written in another language or data format. Because the processing unit 62 configures the message handler 64 each time the peer-vector machine 40 is activated, one can modify the message format merely by modifying the format information stored in the registry 72. Alternatively, an external message-configuration library (not shown) can store information for multiple message formats, and one can design and/or modify the host application so that the processing unit 62 updates the registry 72 from selected parts of the library, and then downloads the desired format information from the updated registry to the message handler 64.

Similarly, to configure the interconnection layout of the pipeline accelerator 44, the processing unit 62 retrieves configuration firmware from the registry 70 and downloads this firmware to the memory 52 via the message handler 64 and the bus 50. The accelerator 44 then configures itself by downloading the firmware from the memory 52 into its interconnection-configuration registers (not shown). Because the processing unit 62 configures the accelerator 44 each time the peer-vector machine 40 is activated, one can modify the interconnection-layout—and thus the functioning—of the accelerator 44 merely by modifying the firmware stored in the registry 70. Alternatively, an external accelerator-configuration library (not shown) can store firmware for multiple configurations of the accelerator 44, and one can design and/or modify the host application so that the processing unit 62 updates the registry 70 from selected parts of the library, and then downloads the desired firmware from the updated registry to the memory 52. Furthermore, the external library or the registry 70 may store firmware modules that define different portions and/or functions of the accelerator 44. The external library or the registry 70 can have many different kinds of data, including compiled PLIC code, high level design modules, templates, data configuration files, software executable files, and so on. Therefore, one can use these modules to facilitate the design and/or modification of the accelerator 44. In addition, the processing unit 62 may use these modules to modify the accelerator 44 while the machine 40 is processing data.

The processing unit 62 may also "soft configure" the pipeline accelerator 44 while the peer-vector machine 40 is processing data. That is, the processing unit 62 may configure the functioning of the accelerator 44 without altering the accelerator's interconnection layout.

With regard to processing data in the peer-vector machine 40, in general the peer-vector machine effectively divides the processing of raw data between the host processor 42 and the pipeline accelerator 44. For example, the host processor 42 may perform most or all of the decision-making operations related to the data, and the accelerator 44 may perform most or all of the mathematically intensive operations on the data. However, the machine 40 can divide the data processing in any desired manner.

Regarding the operation of the host processor 42, in one embodiment the host processor receives the raw data from and provides the resulting processed data to a remote device such as a sonar array (FIG. 4). The host processor 42 first receives the raw data from the remote device via the input port 54 or the bus 50. The peer-vector machine 40 may include a FIFO (not shown) for buffering the received raw data.

Next, the processing unit 62 prepares the raw data for processing by the pipeline accelerator 44. For example, the unit 62 may determine, e.g., which of the raw data to send to the accelerator 44 or in which sequence to send the raw data. Or, the unit 62 may process the raw data to generate intermediate data for sending to the accelerator 44. While preparing the raw data, the processing unit 54 may also generate one or more "soft-configuration" commands to modify the functioning of the accelerator 44. Unlike the firmware that configures the interconnection layout of the accelerator 44 when the machine 40 is activated, a soft-configuration command controls the functioning of the accelerator without altering its interconnection layout. For example, a soft-configuration command may control the size of the data strings (e.g., 32 bits or 64 bits) that the accelerator 44 processes.

The processing unit 62 then loads the prepared data and/or soft-configuration command(s) into a corresponding location of the interface memory 48, which acts as a FIFO buffer between the unit 62 and the accelerator 44. Next, the message handler 64 retrieves the prepared data and/or software command(s) from the interface memory 48 and generates message objects that include the data and/or command(s) and related information. Typically, the accelerator 44 needs four identifiers that describe the data/command(s) and the related information (collectively "information"): a) the information's intended destination (e.g., the pipeline $74_1$), b) the priority (e.g., should the accelerator process this data before or after previously received data), c) the length or the end of the message object, and d) the unique instance of the data (e.g., sensor signal number nine from an array of one thousand sensors). To facilitate this determination, the message handler 64 generates message objects that have a format as discussed above. In addition to the prepared data/soft-configuration command(s), a message object typically includes a header that includes the four above-described identifiers and that may also include identifiers that describe the type of information that object includes (e.g., data, command), and the algorithm by which the data is to be processed. This latter identifier is useful where the destination pipeline 74 implements multiple algorithms. The handler 64 may retrieve the header information from the interface memory 48, or may generate the header based on the location within the interface memory from which it retrieves the prepared data or command(s). By deciphering the message header, the router 61 and/or the accelerator 44 can direct the information within the message object to the desired destination, and cause that destination to process the information in a desired sequence.

Alternative embodiments for generating the message objects exist. For example, although each message object is described as including either data or a soft-configuration command, a single message object may include both data and one or more commands. Furthermore, although the message handler 64 is described as receiving the data and commands from the interface memory 48, it may receive the data and commands directly from the processing unit 54.

The pipeline accelerator 44 receives and deciphers the message objects from the message handler 64 and effectively directs the data and/or commands within the objects to the desired destination(s). This technique is particularly useful where the number of algorithms implemented by the processing unit 62 and the pipelines 74 are relatively small, and thus the router 61 can be omitted. Alternatively, where the number of algorithms implemented by the processing unit 62 or the number pipelines 74 is relatively large, the router 61 receives and deciphers the message objects from the message handler 64 and effectively directs the data and/or commands within the objects to the desired destination(s) within the accelerator 44.

In one embodiment where there are small numbers of processing-unit algorithms and pipelines 74, each pipeline simultaneously receives a message object and analyzes the header to determine whether or not it is an intended recipient of the message. If the message object is intended for a particular pipeline 74, then that pipeline deciphers the message and processes the recovered data/command(s). If, however, the message object is not intended for a particular pipeline 74, then that pipeline ignores the message object. For example, suppose a message object includes data for processing by the pipeline $74_1$. Therefore, the pipeline $74_1$ analyzes the message header, determines that it is an intended destination for the data, recovers the data from the message, and processes the recovered data. Conversely, each of the pipelines $74_2$-$74_n$ analyzes the message header, determines that it is not an intended destination for the data, and thus does not recover or process the data. If the data within the message object is intended for multiple pipelines 74, then the message handler 64 generates and sends a sequence of respective message objects that include the same data, one message for each destination pipeline. Alternatively, the message handler 64 may simultaneously send the data to all of the destination pipelines 74 by sending a single message object having a header that identifies all of the destination pipelines.

In another embodiment where there are large numbers of processing-unit processes or pipelines 74, each pipeline receives message objects from the router 61. Although the router 61 should ideally send message objects only to the target pipeline 74, the target pipeline still analyzes the header to determine whether or not it is an intended recipient of the message. Such an analysis identifies potential message routing errors, i.e., exceptions. If the message object is intended for target pipeline 74, then that pipeline deciphers the message and processes the recovered data/command(s). If, however, the message object is not intended for the target pipeline 74, then that pipeline ignores the processing for that message object, and may also issue a new message to the host processor 42 indicating that a routing exception has occurred. Next, the pipeline accelerator 44 processes the incoming data and/or commands recovered from the message objects.

For data, the destination pipeline or pipelines 74 perform a respective operation or operations on the data. As discussed in conjunction with FIG. 2, because the pipelines 74 do not execute program instructions, they can often process the data at a rate that is substantially the same as the frequency of the pipeline clock.

In a first embodiment, a single pipeline 74 generates resulting data by processing the incoming data. In a second embodiment, multiple pipelines 74 generate resulting data by serially processing the incoming data. For example, the pipeline 74 may generate first intermediate data by performing a first operation on the incoming data. Next, the pipeline $74_2$ may generate second intermediate data by performing a second operation on the first intermediate data, and so on, until the final pipeline 74 in the chain generates the result data.

In a third embodiment, multiple pipelines 74 generate the resulting data by processing the incoming data in parallel. For example, the pipeline $74_1$ may generate a first set of resulting data by performing a first operation on a first set of the incoming data. At the same time, the pipeline $74_2$ may generate a second set of resulting data by performing a second operation on a second set of the incoming data, and so on.

Alternatively, the pipelines 74 may generate resulting data from the incoming data according to any combination of the above three embodiments. For example, the pipeline 74$_1$ may generate a first set of resulting data by performing a first operation on a first set of the incoming data. At the same time, the pipelines 74$_2$ and 74$_n$ may generate a second set of resulting data by serially performing second and third operations on a second set of the incoming data.

In any of the above embodiments and alternatives, a single pipeline 74 may perform multiple operations. For example, the pipeline 74$_1$ may receive data, generate first intermediate data by performing a first operation on the received data, temporarily store the first intermediated data, generate second intermediate data by performing a second operation on the first intermediate data, and so on, until it generates result data. There are a number of techniques for causing the pipeline 74$_1$ to switch from performing the first operation to performing the second operation, and so on. For a soft-configuration command, the accelerator 44 sets the bits in the corresponding soft-configuration register(s) (not shown) as indicated by the message header. As discussed above, setting these bits typically changes the functioning of the accelerator 44 without changing its interconnection layout. This is similar to setting bits in a control register of a processor for, e.g., setting an external pin as an input pin or an output pin or selecting an addressing mode. Furthermore, a soft-configuration command can partition a register or table (an array of registers) for holding data. Another soft-configuration command or an operation performed by the accelerator 44 may load data into the soft-configured register or table. Next, the pipeline accelerator 44 provides the resulting data to the host processor 42 via the router 61 (or directly if the router is omitted) for further processing.

Alternatively, the accelerator 44 provides the resulting data to the remote destination (FIG. 4) either directly via the output port 94 (FIG. 4), or indirectly via the router 61 (if present), the bus 50, the host processor 42, and the output port 58. Consequently, in this alternative embodiment, the resulting data generated by the accelerator 44 is the final processed data.

When the accelerator 44 provides the resulting data to the host processor 42—either for further processing or for pass through to the remote device (FIG. 4)—it sends this data in a message object that has the same format as the message objects generated by the message handler 64. Like the message objects generated by the message handler 64, the message objects generated by the accelerator 44 include headers that specify, e.g., the destination and the priority of the resulting data. For example, the header may instruct the message handler 64 to pass through the resulting data to the remote device via the port 58, or may specify which portion of the program executed by the processing unit 62 is to control the processing of the data. By using the same message format, the accelerator 44 has the same interface layer as the host processor 42. This facilitates designing and modifying the peer-vector machine 40, particularly if the interface layer is an industry standard.

Receiving and processing from the pipeline accelerator 44 with the host processor 42 will now be described in more detail. When it receives a message object from the accelerator 44, the message handler 64 first deciphers the message header and directs the recovered data to the indicated destination.

If the header indicates that the data is to be passed to the remote device (FIG. 4) via the port 58, then the message handler 64 may provide the data directly to the port 58, or to a port FIFO buffer (not shown) formed in the interface memory 48 or in another memory and then from the buffer to the port 58. Multiple ports 58 and multiple respective remote devices are also contemplated. If, however, the header indicates that the processing unit 62 is to further process the data, then the message handler 62 stores the data in a location of the interface memory 48 that corresponds to the portion of the processing-unit program that is to control the processing of the data. More specifically, the same header now indirectly indicates which portion(s) of the program executed by the processing unit 54 is(are) to control the processing of the data. Consequently, the message handler 64 stores the data in the location (such as a FIFO) of the interface memory 48 corresponding to this program portion.

As discussed above, the interface memory 48 acts as a buffer between the accelerator 44 and the processing unit 62, and thus allows the transfer of data when the processing unit is not synchronized to the accelerator. For example, this lack of synchronization may occur when the accelerator 44 processes data faster than the processing unit 62. By using the interface memory 48, the accelerator 44 is not slowed by the slower response of the processing unit 62. This also avoids the inefficiency penalties associated with the processing unit's indeterminate response time to handling interrupts. The indeterminate handling by the processing unit 62 of the accelerator 44 output messages would unnecessarily complicate the accelerator's design by forcing the designer to provide either: a) storage and handling for the backed up output messages, or b) idling controls throughout the pipeline to prevent the backed up messages from being overwritten. Therefore, the use of interface memory 48, which acts as a buffer between the accelerator 44 and the processing unit 62, has several desirable consequences a) accelerators are easier to design, b) accelerators need less infrastructure and can hold larger PLIC applications, c) accelerators can be streamlined to run faster because output data is not "blocked" by a slower processor.

Then, for data that the message handler 64 has stored in the interface memory 48, the processing unit 62 retrieves the data from the interface memory. The processing unit 62 may poll the interface memory 48 to determine when new data has arrived in a particular location, or the message handler 64 may generate an interrupt or other signal that notifies the processing unit of the data's arrival. In one embodiment, before the processing unit 62 retrieves data, the message handler 64 generates a message object that includes the data. More specifically, one may design the program executed by the processing unit 62 to receive data in message objects. The message handler 64, therefore, could store a message object in the interface memory 48 instead of storing only the data. But a message object typically occupies significantly more memory space than does the data it contains. Consequently, to save memory, the message handler 64 deciphers a message object from the pipeline accelerator 44, stores the data in the memory 48, and then effectively regenerates the message object when the processing unit 62 is ready to receive the data. Then, the processing unit 62 deciphers the message object and processes the data under the control of the program portion identified in the message header.

Next, the processor unit 62 processes the retrieved data under the control of the destination portion of the program, generates processed data, and stores the processed data in a location of the interface memory 48 that corresponds to the intended destination of the processed data.

Then, the message handler 64 retrieves the processed data and provides it to the indicated destination. To retrieve the processed data, the message handler 64 may poll the memory 48 to determine when the data has arrived, or the processing unit 62 may notify the message handler of the data's arrival with an interrupt or other signal. To provide the processed data to its intended destination, the message handler 64 may generate a message object that includes the data, and send the message object back to the accelerator 44 for further processing of the data. Or, the handler 56 may send the data to the port 58, or to another location of the memory 48 for further processing by the processing unit 62.

Still referring to FIG. 3, there exist alternatives to the above-described embodiments in which the host processor 42 receives and processes data, and then sends the data to the pipeline accelerator 44 for further processing. In one alternative, the host processor 42 performs all of the processing on at least some of the data, and thus does not send this data to the pipeline accelerator 44 for further processing. In another alternative, the pipeline accelerator 44 receives the raw data directly from the remote device (FIG. 4) via the port 92 (FIG. 4) and processes the raw data. The accelerator 44 may then send the processed data directly back to the remote device via the port 94, or may send the processed data to the host processor 42 for further processing. In the latter case, the accelerator 44 may encapsulate the data in message objects as discussed above. In yet another alternative, the accelerator 44 may include, in addition to the hardwired pipelines 74, one or more instruction-executing processors, such as a Digital Signal Processor (DSP), to complement the number-crunching abilities of the pipelines.

Still referring to FIG. 3, in one embodiment, the pipeline bus 50 is a standard 133 MHz PCI bus, the pipelines 74 are included on one or more standard PMC cards, and the memory 52 is one or flash memories that are each located on a respective PMC card.

FIG. 4 is a block diagram of a sonar system 80 that incorporates the peer-vector machine 40 of FIG. 3 according to an embodiment. In addition to the machine 40, the system 80 includes an array 82 of transducer elements $84_1$-$84_n$ for receiving and transmitting sonar signals, digital-to-analog converters (DACs) $86_1$-$86_n$, analog-to-digital converters (ADCs) $88_1$-$88_n$, and a data interface 90. Because generating and processing sonar signals are often mathematically intensive functions, the machine 40 can often perform these functions more quickly and efficiently than a conventional computing machine—can for a given clock frequency as discussed above in conjunction with FIG. 3.

During a transmit mode of operation, the array 82 transmits a sonar signal into a medium such as water (not shown). First, the peer-vector machine 40 converts raw signal data received on the port 92 into n digital signals, one for each of the array elements 84. The magnitudes and phases of these signals dictate the transmission-beam pattern of the array 82. Next, the machine 40 provides these digital signals to the interface 90, which provides these signals to the respective DACs 86 for conversion into respective analog signals. For example, the interface 90 may act as a buffer that serially receives the digital signals from the machine 40, stores these signals until it receives and buffers all n of them, and then simultaneously provides these sequential signal samples to the respective DACs 86. Then, the transducer elements 84 convert these analog signals into respective sound waves, which interfere with one another to form the beams of a sonar signal.

During a receive mode of operation, the array 82 receives a sonar signal from the medium (not shown). The received sonar signal is composed of the portion of the transmitted sonar signal that is reflected by remote objects and the sound energy emitted by the environment and the remote objects. First, the transducer elements 84 receive respective sound waves that compose the sonar signal, convert these sound waves into n analog signals, and provide these analog signals to the ADCs 88 for conversion into n respective digital signals. Next, the interface 90 provides these digital signals to the peer-vector machine 40 for processing. For example, the interface 90 may act as a buffer that receives the digital signals from the ADCs 88 in parallel and then serially provides these signals to the machine 40. The processing that the machine 40 performs on the digital signals dictates the receive-beam pattern of the array 82. Additional processing steps such as filtering, band shifting, spectral transformation (e.g., the Fourier Transform), and convolution are applied to the digital signals. The machine 40 then provides the processed signal data via the port 94 to another apparatus such as a display device for viewing located objects.

Remote Sensing and Edge Factory Techniques

Figure 5A:
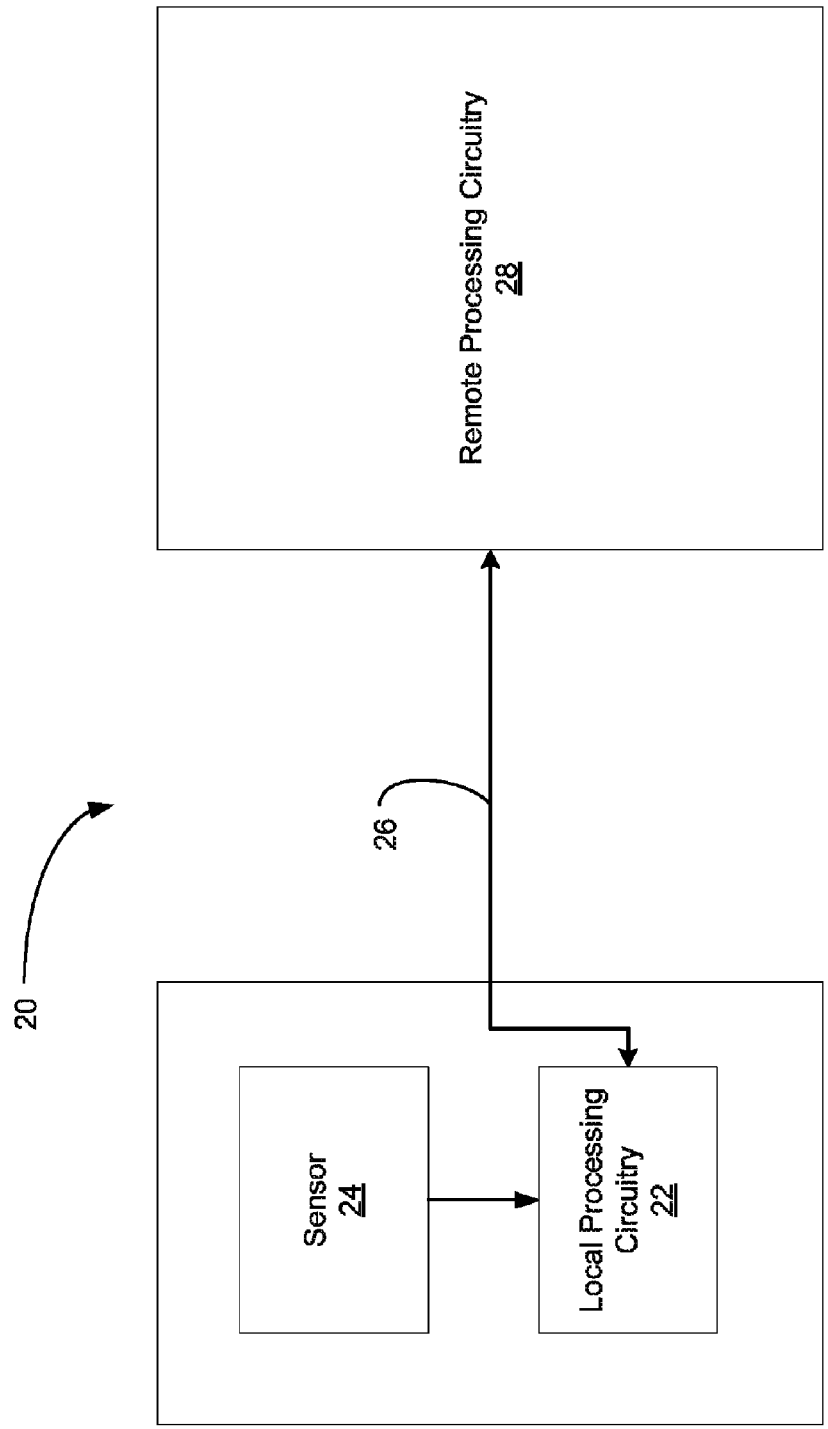
FIG. 5A is a functional block diagram of a system including local processing circuitry positioned proximate associated sensors for processing data from the sensors prior to communicating sensor data to remote processing circuitry according to one embodiment.

The remote sensing embodiments where the edge factory techniques are coupled to the pipeline unit side of a peer-vector machine are now described in more detail with reference to FIGS. 5A-5D, 6, and 7. FIG. 5A is a functional block diagram of a system 20 according to one embodiment. The system 20 includes local processing circuitry 22 positioned proximate associated sensors 24 for processing data from the sensors prior to communicating processed sensor data over a communications channel 26 to remote processing circuitry 28, as will be described in more detail below. In operation, the local processing circuitry 22 processes data from the sensors 24 prior to communicating corresponding sensor data over the communications channel 26, which was referred to as the cable 106 in a conventional system. This reduces the amount of data that must be communicated over the channel 26 to the remote processing circuitry 28, meaning an existing low bandwidth channel may be utilized.

In an embodiment, a new computing architecture referred to as a peer vector machine (PVM) is utilized in the system 20 to allow the sensors 24 to be upgraded without replacing the communications channel 26. With the peer vector machine architecture a host processor forms the remote processing circuitry 28 and controls the overall operation and decision making operations of the system 20. A pipeline accelerator forms the local processing circuitry 22 and performs mathematically intensive operations on data. The pipeline accelerator and host processor are "peers" and communicate with each through data vectors transferred over the communications channel 26. All these embodiments will be described in more detail below.

Still referring to FIG. 5A, in the system 20 the sensors 24 may be replaced with newer sensors without the need to replace the older relatively low bandwidth communications channel 26. Such newer sensors 24 may be faster, more reliable, and more accurate than the older sensors being replaced. The ability to replace the sensors 24 without replacing the channel 26 is particularly useful in systems where the channel is not easily replaced, such as where the channel corresponds to cables coupled to sonar sensors on board a ship or cables contained within the walls of a nuclear reactor, for example. More specifically, when the sensors 24 in the system 20 need to be replaced, the sensors themselves are simply removed and replaced with new sensors coupled to suitable local processing circuitry 22 for processing signals from the sensors.

The local processing circuitry 22 processes the signals from the sensors 24 to generate corresponding sensor data, and thereafter communicates this sensor data via the communications channel 26 to the remote processing circuitry 28. The specific type of processing performed by the local processing circuitry 22 varies and depends on the specific type of system. For example, where the system 20 is a sonar system the sensors 24 may correspond to a sensor array, and the local processing circuitry 22 may process signals from each of the sensors in the sensor array to calculate a direction vector for an object being tracked. Having calculated the direction vector, the local processing circuitry 22 then communicates data corresponding to this vector over the channel 26 to the remote processing circuitry 28. The local processing circuitry 22 eliminates the need to communicate the data from all sensors 24 in the array over the channel 26 for processing by the circuitry 28. This may enable an existing relatively low bandwidth channel 26 to be utilized while allowing the sensors 24 to be upgraded. In another example, the remote processing circuitry 28 may apply commands to the local processing circuitry 22 via the communications channel 26, and in response to these commands the local processing circuitry may condition data from the sensors 24 appropriately and send only the desired data. The remote processing circuitry 28 may, for example, send a command via the channel 26 to the local processing circuitry 22 so as to adjust the gains of the sensors 24 or to specify a frequency band of interest so that the local processing circuitry only sends data corresponding to this frequency band over the communications channel 26 to the remote processing circuitry 28.

Sensors as discussed herein include a transducer portion that senses a physical parameter, such as pressure, temperature, acceleration, and so on, and generates an electrical signal responsive to the sensed physical parameter. Each sensor may also include associated electronic circuitry for conditioning the electrical signal, such as filtering circuitry and an analog-to-digital converter for digitizing the analog electrical signal. A sensor may also include a digital-to-analog converter for converting an applied digital value into a corresponding analog electrical signal which, in turn, the transducer portion of the sensor converts into a physical quantity such as a sound wave.

Bidirectionali communications over the channel 26 may be required in the situation where the system 20 is a sonar system and the array of sensors 24 function as an "active array" to transmit desired signals. In this example, the remote processing circuitry 28 communicates data via SDSL over the channel 26 to the remote processing circuitry 22. In response to the received data, the local processing circuitry 22 then applies signals to sensors 24 in the sensor array that causes the sensors to convert the received signal into a corresponding sound wave. As will be appreciated by those skilled in the art, where the system 20 is a sonar system the sensors 24 convert sound waves incident upon the sensors into corresponding electrical signals and where the array is an active array the sensors convert applied electrical signals into corresponding sound waves.

Figure 5B:
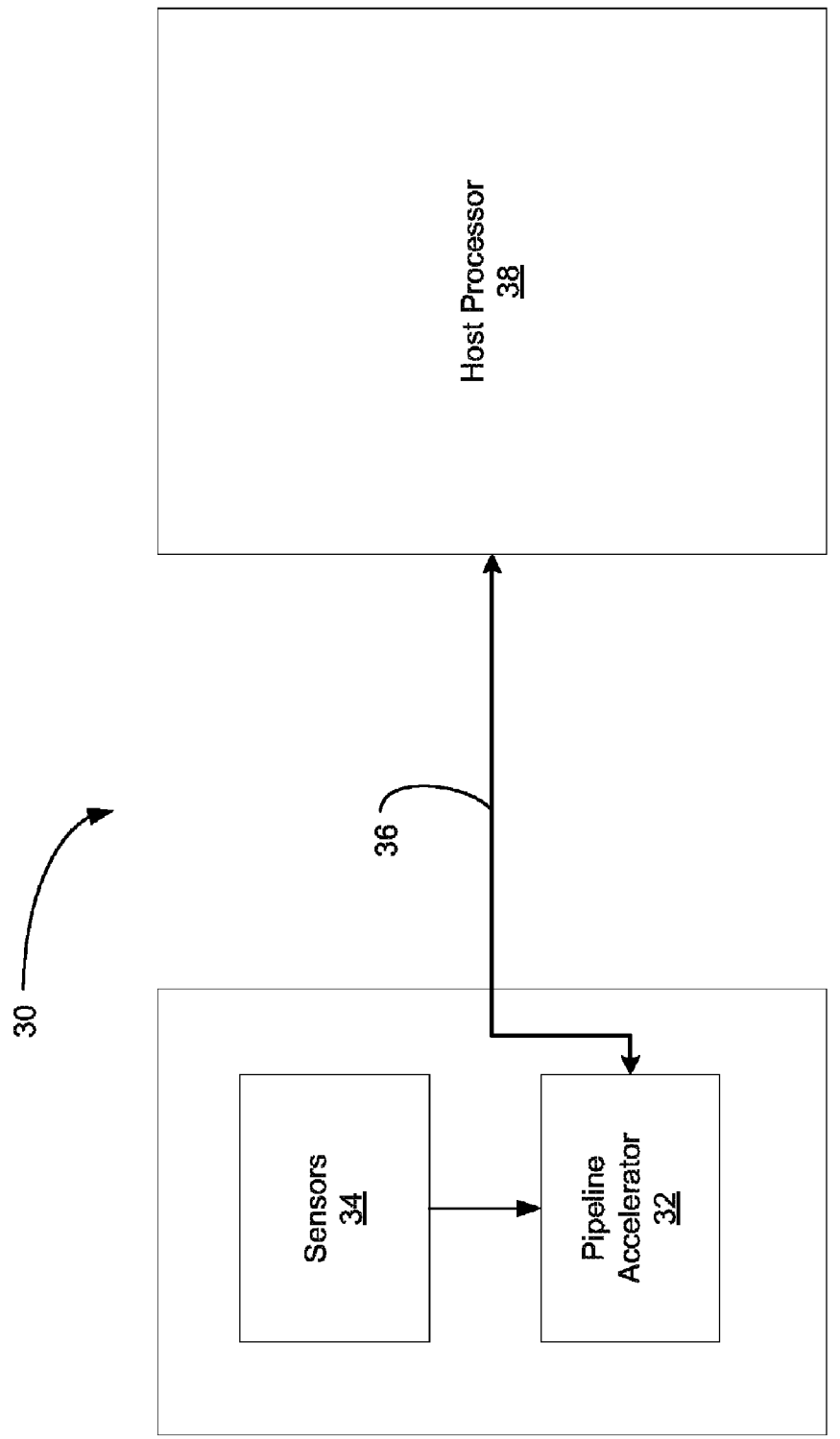
FIG. 5B is a block diagram of a system including a peer vector machine corresponding to the local and remote processing circuitry of FIG. 5A according to another embodiment.

In many situations there may be space limitations as to the overall size of the local processing circuitry 22 and new sensors 24. The old sensors 24 occupied a certain amount of space in the system and this space cannot be increased, so the new sensors and associated local processing circuitry 22 needs to be fit into that same space. This situation requires a high level of integration of the circuitry forming the local processing circuitry 22. A peer vector machine (PVM) architecture as illustrated in FIG. 5B is particularly advantageous in this situation, as previously mentioned and as will now be explained in more detail. FIG. 5B illustrates a system 30 including a pipeline accelerator 32 coupled to sensors 34 and coupled through a communications channel 36 to a host processor 38. The sensors 34 and channel 36 are the same as that discussed with reference to FIG. 5A, and thus will not again be described in more detail. A firmware memory (not shown in FIG. 5B) is coupled to pipeline accelerator 32 and stores configuration data to configure programmable hardware in the pipeline accelerator 32 to perform desired functions without executing programming instructions, as will be explained in more detail below.

In the system 30 the peer vector machine architecture divides the processing power of the system into two primary components, the pipeline accelerator 32 and host processor 38 that together form the peer vector machine. In the system 30 the pipeline accelerator 32 forms the local processing circuitry 202 of FIG. 5A and the host processor 38 forms the remote processing circuitry 208 of FIG. 5A. The host processor 38 performs a portion of the overall computing burden of the system 30 and primarily handles all decision making operations of the system. The pipeline accelerator 32 on the other hand does not execute any programming instructions and handles the remaining portion of the processing burden, primarily performing mathematically intensive or "number crunching" types of operations. The host-processor 38 and the pipeline accelerator 32 are termed "peers" that transfer data vectors back and forth via the communications channel 36. By combining the decision-making functionality of the host processor 38 and the number-crunching functionality of the pipeline accelerator 32, the use of the peer vector machine enables the system 30 to process data faster than conventional computing architectures such as multiprocessor architectures, as will be discussed in more detail below.

With the peer vector machine architecture, the pipeline accelerator 32 may be implemented through programmable logic integrated circuits (PLICs) that greatly reduce the size of the circuitry that is contained proximate the sensors 34, which may be required to upgrade sensors in existing systems as previously discussed. Finally, and as will also be discussed in more detail below, the pipeline accelerator 32 communicates with the host processor 38 over the communications channel 36 typically through an industry standard communications interface (not shown). The use of such a standard communications interface simplifies the design and modification of the pipeline accelerator 32 and overall system 30, as will also be discussed in more detail below.

Figure 5C:
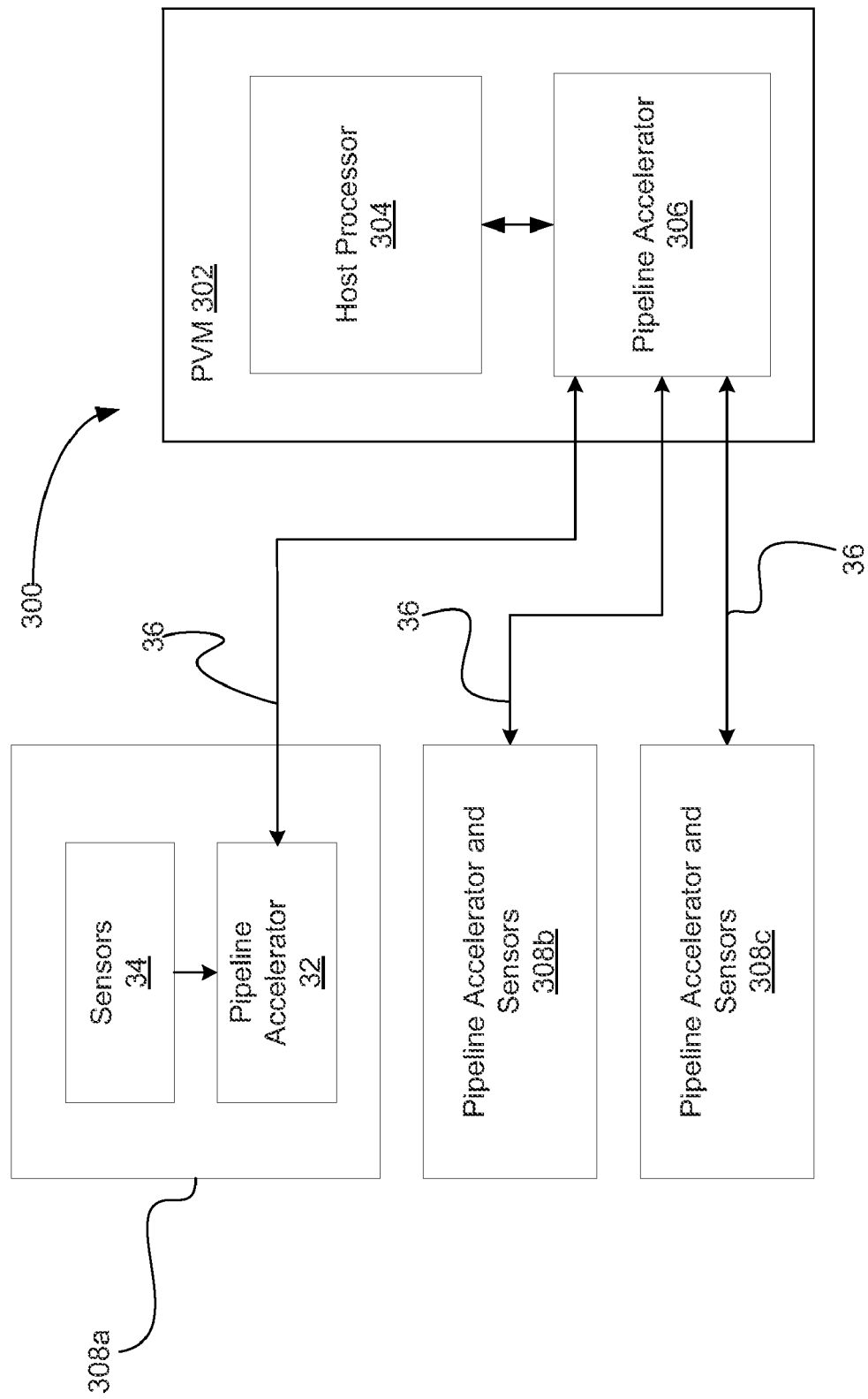
FIG. 5C illustrates a system in which a peer vector machine is coupled through respective communications channels to pipeline accelerator and sensor units according to another embodiment.

FIG. 5C illustrates a system 300 including a peer vector machine 302 containing a host processor 304 and pipeline accelerator 306 coupled through respective communications channels 36 to pipeline accelerator and sensor units 308a-c according to another embodiment. As shown in more detail for the unit 308a, each unit 308 includes sensors 34 coupled to a corresponding pipeline accelerator 32. Each accelerator 32 receives data from the corresponding sensor 34, processes this data, and communicates this processed data over the corresponding communications channel 36. Where communications over the channels 36 are through a bandwidth-enhancement protocol such as xDSL, one of the pipeline units (not shown) in the pipeline accelerator is configured to form the required interface to perform these communications. The same is true of one of the pipeline units (not shown) in the pipeline accelerator 306 in the peer vector machine 302.

Figure 5D:
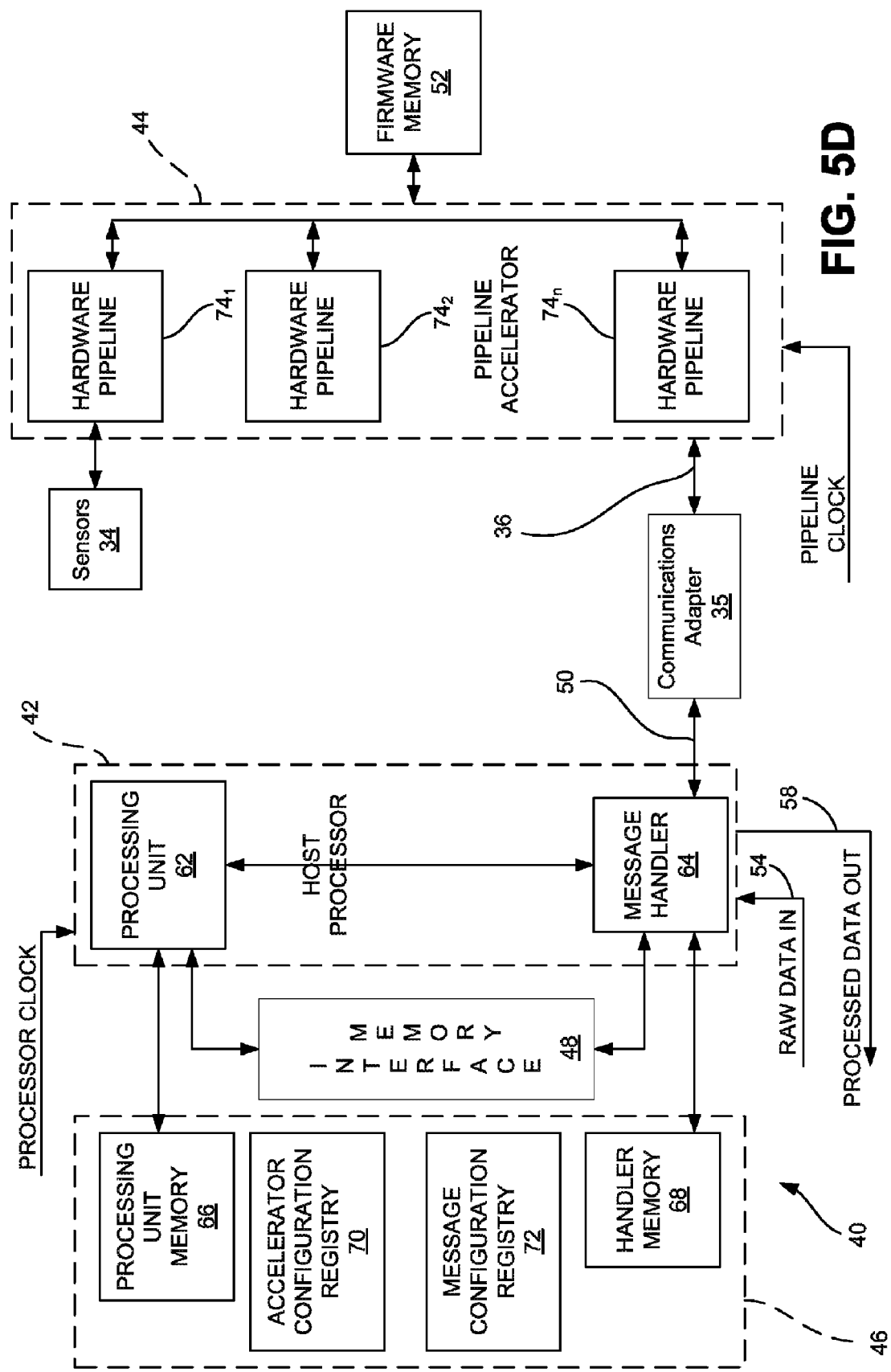
FIG. 5D is a more detailed functional block diagram of one embodiment of the host processor and pipeline accelerator of the peer vector machine for implementing the frameworks of FIGS. 1 and 2.

FIG. 5D is a more detailed functional block diagram of a peer vector machine 40 that may be included in the system 30 of FIG. 5B according to one embodiment. The peer vector machine 40 includes a host processor 42 corresponding to the host processor 38 of FIG. 5B and a pipeline accelerator 44 corresponding to the pipeline accelerator 32 of FIG. 5B. The host processor 42 communicates with the pipeline accelerator 44 over the communications channel 36 (FIG. 5B) and through a communications adapter 35. The communications interface 35 and host processor 42 communicate data over the communications channel 36 according to an industry standard interface in one embodiment, which facilitates the design and modification of the machine 40. If the circuitry in the pipeline accelerator 44 changes, the communications adapter 35 need merely be modified to interface this new accelerator to the channel 36. In the example embodiment of FIG. 5D, the sensors 34 are coupled directly to one of a plurality of hardware or hardwired pipelines $74_1$-$_n$ in the pipeline accelerator 44. The hardwired pipeline $74_1$ processes data without executing program instructions, as do each of the pipelines 74 to perform required tasks. A firmware memory 52 stores the configuration firmware for the accelerator 44 to configure the hardwired pipelines 74 to execute these tasks, as will be described in more detail below.

In addition to the host processor 42 and the pipeline accelerator 44, the peer vector computing machine 40 includes a processor memory 46, an interface memory 48, a bus 50, a firmware memory 52, an optional raw-data input port 54, a processed-data output port 58, and an optional router 61.

The host processor 42 includes a processing unit 62 and a message handler 64, and the processor memory 46 includes a processing-unit memory 66 and a handler memory 68, which respectively serve as both program and working memories for the processor unit and the message handler. The processor memory 46 also includes an accelerator-configuration registry 70 and a message-configuration registry 72, which store respective configuration data that allow the host processor 42 to configure the functioning of the accelerator 44 and the format of the messages that the message handler 64 sends and receives.

The pipeline accelerator 44 is disposed on at least one programmable logic integrated circuit (PLIC) (not shown) and includes hardwired pipelines $74_1$-$74_n$, which process respective data without executing program instructions. The firmware memory 52 stores the configuration firmware for the accelerator 44. If the accelerator 44 is disposed on multiple PLICs, these PLICs and their respective firmware memories may be disposed in multiple pipeline units (FIG. 5D). Alternatively, the accelerator 44 may be disposed on at least one application specific integrated circuit (ASIC), and thus may have internal interconnections that are not configurable. In this alternative, the machine 40 may omit the firmware memory 52. Furthermore, although the accelerator 44 is shown including multiple pipelines 74, it may include only a single pipeline. In addition, although not shown, the accelerator 44 may include one or more processors such as a digital-signal processor (DSP).

As previously mentioned, in the embodiment of FIG. 5D the sensors 34 are shown coupled to the pipeline bus 50, which corresponds to the communications channel 36 of FIG. 5B. In this embodiment, the sensors 34 would of course include suitable circuitry for communicating raw data from the sensors over the pipeline bus, typically through an industry standard communications protocol or interface such as RapidIO. In another embodiment, the sensors 34 are coupled to the bus 50 and communicate data via the bus to the pipeline accelerator 44. The data provided is stored in memory (not shown) in the pipeline accelerator 44, and is read out of memory and processed by the appropriate one of the hardware pipelines 74. The accelerator 44 may further include a data output port for directly supplying data to the sensors 34, which corresponds to the interconnection between the sensors and pipeline $74_1$ in FIG. 5D. The pipeline accelerator 44 can supply data to the sensors 34 where the system 30 containing the peer vector machine 40 is a sonar system and the sensors are to be utilized to transmit desired sound waves, as previously mentioned. Data to be supplied to the sensors 34 is supplied over the pipeline bus 50 and communications channel 36 and stored in memory (not shown) in the accelerator 44, and is thereafter retrieved from memory and output through the data output port to the sensors.

Figure 6:
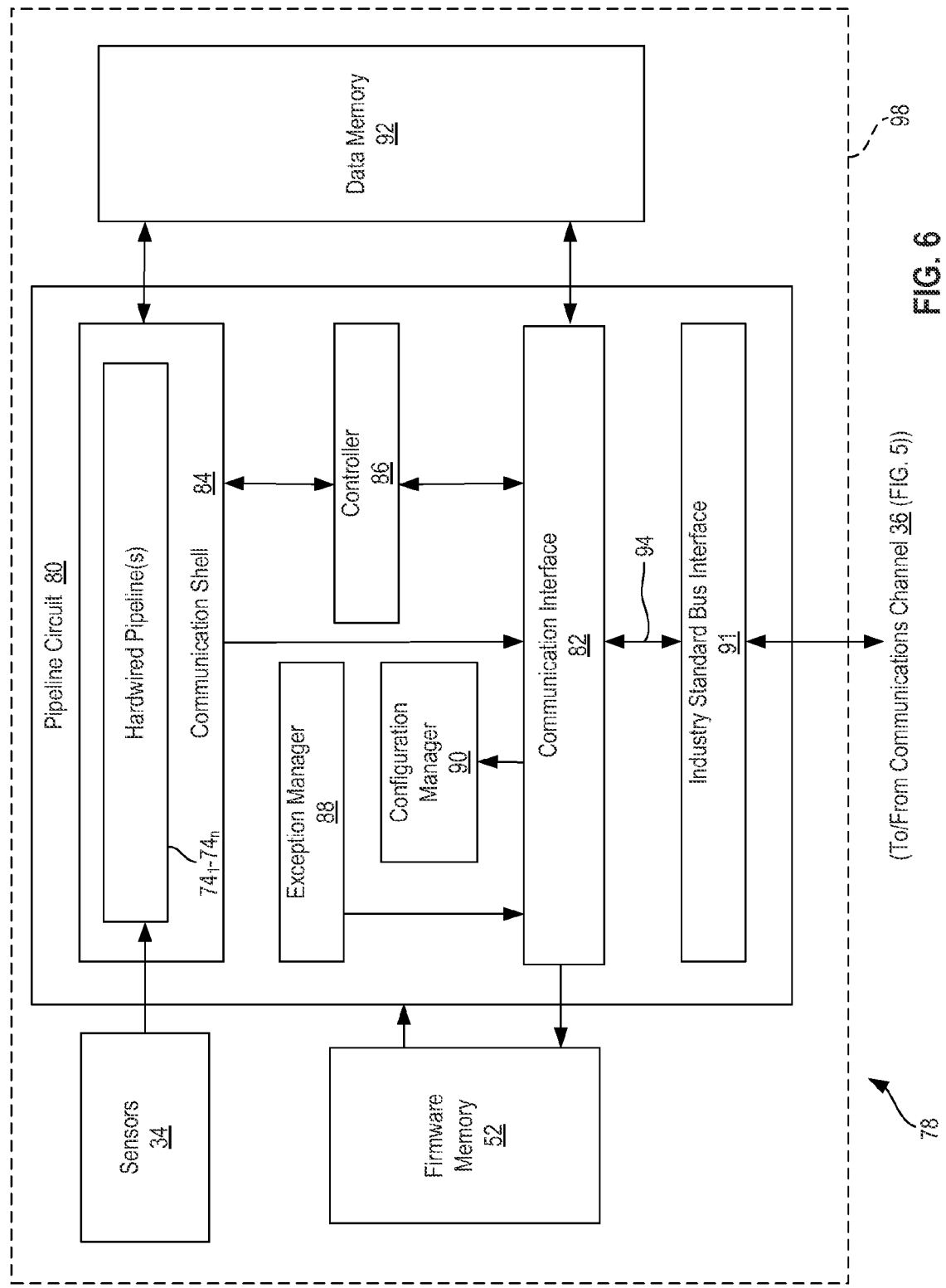
FIG. 6 is a more detailed block diagram of one embodiment of the pipeline accelerator of FIG. 5D.

FIG. 6 is a more detailed block diagram of the pipeline accelerator 44 of FIG. 5D according to one embodiment. The accelerator 44 includes one or more pipeline units 78, one of which is shown in FIG. 6. Each pipeline unit 78 includes a pipeline circuit 80, such as a PLIC or an ASIC. Each pipeline unit 78 is a "peer" of the host processor 42 and of the other pipeline units of the accelerator 44. That is, each pipeline unit 78 can communicate directly with the host processor 42 or with any other pipeline unit. Thus, this peer-vector architecture prevents data "bottlenecks" that otherwise might occur if all of the pipeline units 78 communicated through a central location such as a master pipeline unit (not shown) or the host processor 42. Furthermore, it allows one to add or remove peers from the peer-vector machine 40 (FIG. 5B) without significant modifications to the machine.

The pipeline circuit 80 includes a communication interface 82, which transfers data between a peer, such as the host processor 42 (FIG. 5B), and the following other components of the pipeline circuit: the hardwired pipelines $74_1$-$74_n$ (FIG. 5B) via a communication shell 84, a controller 86, an exception manager 88, and a configuration manager 90. The pipeline circuit 80 may also include an industry-standard bus interface 91. Alternatively, the functionality of the interface 91 may be included within the communication interface 82. Where a bandwidth-enhancement technique such as xDSL is utilized to increase the effective bandwidth of the pipeline bus 50, the communication interface 82 and bus interface 91 are modified as necessary to implement the bandwidth-enhancement technique, as will be appreciated by those skilled in the art.

The communication interface 82 sends and receives data in a format recognized by the message handler 64 (FIG. 5D), and thus typically facilitates the design and modification of the peer-vector machine 40 (FIG. 5D). For example, if the data format is an industry standard such as the Rapid I/O format, then one need not design a custom interface between the host processor 42 and the accelerator 44. Furthermore, by allowing the pipeline circuit 80 to communicate with other peers, such as the host processor 42 (FIG. 5B), via the pipeline bus 50 instead of via a non-bus interface, one can change the number of pipeline units 78 by merely coupling or uncoupling them (or the circuit cards that hold them) to/from the pipeline bus instead of redesigning a non-bus interface from scratch each time a pipeline unit is added or removed.

The hardwired pipelines $74_1$-$74_n$ perform respective operations on data as discussed above in conjunction with FIG. 5B, and the communication shell 84 interfaces the pipelines to the other components of the pipeline circuit 80 and to circuits (such as a data memory 92 discussed below) external to the pipeline circuit.

The controller 86 synchronizes the hardwired pipelines $74_1$-$74_n$ and monitors and controls the sequence in which they perform the respective data operations in response to communications, i.e., "events," from other peers. For example, a peer such as the host processor 42 may send an event to the pipeline unit 78 via the pipeline bus 50 to indicate that the peer has finished sending a block of data to the pipeline unit and to cause the hardwired pipelines $74_1$-$74_n$ to begin processing this data. An event that includes data is typically called a message, and an event that does not include data is typically called a "door bell." Furthermore, as discussed below in conjunction with FIG. 6, the pipeline unit 78 may also synchronize the pipelines $74_1$-$74_n$ in response to a synchronization signal.

The exception manager 88 monitors the status of the hardwired pipelines 74$_1$-74$_n$, the communication interface 82, the communication shell 84, the controller 86, and the bus interface 91, and reports exceptions to the host processor 42 (FIG. 5B). For example, if a buffer in the communication interface 82 overflows, then the exception manager 88 reports this to the host processor 42. The exception manager may also correct, or attempt to correct, the problem giving rise to the exception. For example, for an overflowing buffer, the exception manager 88 may increase the size of the buffer, either directly or via the configuration manager 90 as discussed below.

The configuration manager 90 sets the soft configuration of the hardwired pipelines 74$_1$-74$_n$, the communication interface 82, the communication shell 84, the controller 86, the exception manager 88, and the interface 91 in response to soft-configuration data from the host processor 42 (FIG. 5B), the hard configuration denotes the actual topology, on the transistor and circuit-block level, of the pipeline circuit 80, and the soft configuration denotes the physical parameters (e.g., data width, table size) of the hard-configured components. That is, soft configuration data is similar to the data that can be loaded into a register of a processor (not shown in FIG. 5D) to set the operating mode (e.g., burst-memory mode) of the processor. For example, the host processor 42 may send soft-configuration data that causes the configuration manager 90 to set the number and respective priority levels of queues in the communication interface 82. The exception manager 88 may also send soft-configuration data that causes the configuration manager 90 to, e.g., increase the size of an overflowing buffer in the communication interface 82.

Still referring to FIG. 6, in addition to the pipeline circuit 80, the pipeline unit 78 of the accelerator 44 includes the data memory 92, an optional communication bus 94, and, if the pipeline circuit is a PLIC, the firmware memory 52 (FIG. 5D). The data memory 92 buffers data as it flows between another peer, such as the host processor 42 (FIG. 5D), and the hardwired pipelines 74$_1$-74$_n$, and is also a working memory for the hardwired pipelines. The communication interface 82 interfaces the data memory 92 to the pipeline bus 50 (via the communication bus 94 and industry-standard interface 91 if present), and the communication shell 84 interfaces the data memory to the hardwired pipelines 74$_1$-74$_n$.

The industry-standard interface 91 is a conventional bus-interface circuit that reduces the size and complexity of the communication interface 82 by effectively offloading some of the interface circuitry from the communication interface. Therefore, if one wishes to change the parameters of the pipeline bus 50 or router 61 (FIG. 5D), then he need only modify the interface 91 and not the communication interface 82. Alternatively, one may dispose the interface 91 in an IC (not shown) that is external to the pipeline circuit 80. Offloading the interface 91 from the pipeline circuit 80 frees up resources on the pipeline circuit for use in, e.g., the hardwired pipelines 74$_1$-74$_n$ and the controller 86. Or, as discussed above, the bus interface 91 may be part of the communication interface 82.

As discussed above in conjunction with FIG. 6, where the pipeline circuit 80 is a PLIC, the firmware memory 52 stores the firmware that sets the hard configuration of the pipeline circuit. The memory 52 loads the firmware into the pipeline circuit 80 during the configuration of the accelerator 44, and may receive modified firmware from the host processor 42 (FIG. 5D) via the communication interface 82 during or after the configuration of the accelerator.

Still referring to FIG. 6, the pipeline circuit 80, data memory 92, and firmware memory 52 may be disposed on a circuit board or card 98, which may be plugged into a pipeline-bus connector (not shown) much like a daughter card can be plugged into a slot of a mother board in a personal computer (not shown). Although not shown, conventional ICs and components such as a power regulator and a power sequencer may also be disposed on the card 98 as is known.

Figure 7:
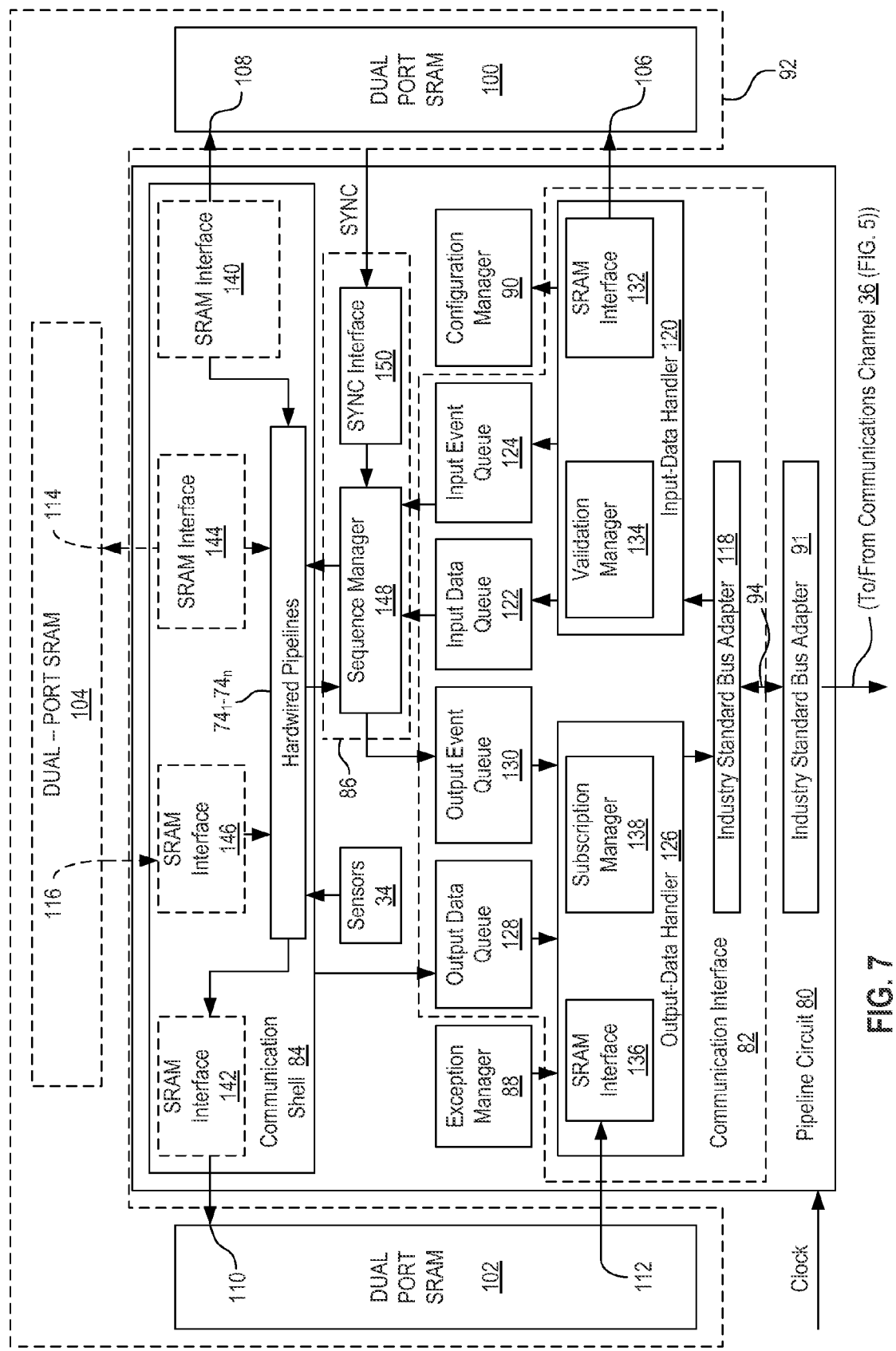
FIG. 7 is an even more detailed block diagram of one embodiment of the hardwired pipeline circuit and the data memory of FIG. 6.

Further details of the structure and operation of the pipeline unit 78 will now be discussed in conjunction with FIG. 7. FIG. 7 is a block diagram of the pipeline unit 78 of FIG. 6 according to an embodiment. For clarity, the firmware memory 52 is omitted from FIG. 7. The pipeline circuit 80 receives a master CLOCK signal, which drives the below-described components of the pipeline circuit either directly or indirectly. The pipeline circuit 80 may generate one or more slave clock signals (not shown) from the master CLOCK signal in a conventional manner. The pipeline circuit 80 may also a receive a synchronization signal SYNC as discussed below. The data memory 92 includes an input dual-port-static-random-access memory (DPSRAM) 100, an output DPSRAM 102, and an optional working DPSRAM 104.

The input DPSRAM 100 includes an input port 106 for receiving data from a peer, such as the host processor 42 (FIG. 5B), via the communication interface 82, and includes an output port 108 for providing this data to the hardwired pipelines 74$_1$-74$_n$ via the communication shell 84. Having two ports, one for data input and one for data output, increases the speed and efficiency of data transfer to/from the DPSRAM 100 because the communication interface 82 can write data to the DPSRAM while the pipelines 74$_1$-74$_n$ read data from the DPSRAM. Furthermore, as discussed above, using the DPSRAM 100 to buffer data from a peer such as the host processor 42 allows the peer and the pipelines 74$_1$-74$_n$ to operate asynchronously relative to one and other. That is, the peer can send data to the pipelines 74$_1$-74$_n$ without "waiting" for the pipelines to complete a current operation. Likewise, the pipelines 74$_1$-74$_n$ can retrieve data without "waiting" for the peer to complete a data-sending operation.

Similarly, the output DPSRAM 102 includes an input port 110 for receiving data from the hardwired pipelines 74$_1$-74$_n$ via the communication shell 84, and includes an output port 112 for providing this data to a peer, such as the host processor 42 (FIG. 5B), via the communication interface 82. As discussed above, the two data ports 110 (input) and 112 (output) increase the speed and efficiency of data transfer to/from the DPSRAM 102, and using the DPSRAM 102 to buffer data from the pipelines 74$_1$-74$_n$ allows the peer and the pipelines to operate asynchronously relative to one another. That is, the pipelines 74$_1$-74$_n$ can publish data to the peer without "waiting" for the output-data handler 126 to complete a data transfer to the peer or to another peer. Likewise, the output-data handler 126 can transfer data to a peer without "waiting" for the pipelines 74$_1$-74$_n$ to complete a data-publishing operation.

The working DPSRAM 104 includes an input port 114 for receiving data from the hardwired pipelines 74$_1$-74$_n$ via the communication shell 84, and includes an output port 116 for returning this data back to the pipelines via the communication shell. While processing input data received from the DPSRAM 100, the pipelines 74$_1$-74$_n$ may need to temporarily store partially processed, i.e., intermediate, data before continuing the processing of this data. For example, a first pipeline, such as the pipeline 74$_1$, may generate intermediate data for further processing by a second pipeline, such as the pipeline 74$_2$; thus, the first pipeline may need to temporarily store the intermediate data until the second pipeline retrieves it. The working DPSRAM 104 provides this temporary storage. As discussed above, the two data ports 114 (input) and 116 (output) increase the speed and efficiency of data transfer between the pipelines $74_1$-$74_n$ and the DPSRAM 104. Furthermore, including a separate working DPSRAM 104 typically increases the speed and efficiency of the pipeline circuit 80 by allowing the DPSRAMS 100 and 102 to function exclusively as data-input and data-output buffers, respectively. But, with slight modification to the pipeline circuit 80, either or both of the DPSRAMS 100 and 102 can also be a working memory for the pipelines $74_1$-$74_n$ when the DPSRAM 104 is omitted, and even when it is present.

Although the DPSRAMS 100, 102, and 104 are described as being external to the pipeline circuit 80, one or more of these DPSRAMS, or equivalents thereto, may be internal to the pipeline circuit.

Still referring to FIG. 7, the communication interface 82 includes an industry-standard bus adapter 118, an input-data handler 120, input-data and input-event queues 122 and 124, an output-data handler 126, and output-data and output-event queues 128 and 130. Although the queues 122, 124, 128, and 130 are shown as single queues, one or more of these queues may include sub queues (not shown) that allow segregation by, e.g., priority, of the values stored in the queues or of the respective data that these values represent.

The industry-standard bus adapter 118 includes the physical layer that allows the transfer of data between the pipeline circuit 80 and the pipeline bus 50 (FIG. 6) via the communication bus 94 (FIG. 6). Therefore, if one wishes to change the parameters of the bus 94, then he need only modify the adapter 118 and not the entire communication interface 82. Where the industry-standard bus interface 91 is omitted from the pipeline unit 78, then the adapter 118 may be modified to allow the transfer of data directly between the pipeline bus 50 and the pipeline circuit 80. In this latter implementation, the modified adapter 118 includes the functionality of the bus interface 91, and one need only modify the adapter 118 if he/she wishes to change the parameters of the bus 50. For example, where a bandwidth-enhancement technique such as ADSL is utilized to communicate data over the bus 50 the adapter 118 is modified accordingly to implement the bandwidth-enhancement technique.

The input-data handler 120 receives data from the industry-standard adapter 118, loads the data into the DPSRAM 100 via the input port 106, and generates and stores a pointer to the data and a corresponding data identifier in the input-data queue 122. If the data is the payload of a message from a peer, such as the host processor 42 (FIG. 5B), then the input-data handler 120 extracts the data from the message before loading the data into the DPSRAM 100. The input-data handler 120 includes an interface 132, which writes the data to the input port 106 of the DPSRAM 100 and which is further discussed below in conjunction with FIG. 7. Alternatively, the input-data handler 120 can omit the extraction step and load the entire message into the DPSRAM 100. The input-data handler 120 also receives events from the industry-standard bus adapter 118, and loads the events into the input-event queue 124.

Furthermore, the input-data handler 120 includes a validation manager 134, which determines whether received data or events are intended for the pipeline circuit 80. The validation manager 134 may make this determination by analyzing the header (or a portion thereof) of the message that contains the data or the event, by analyzing the type of data or event, or the analyzing the instance identification (i.e., the hardwired pipeline 74 for which the data/event is intended) of the data or event. If the input-data handler 120 receives data or an event that is not intended for the pipeline circuit 80, then the validation manager 134 prohibits the input-data handler from loading the received data/even. Where the peer-vector machine 40 includes the router 61 (FIG. 5B) such that the pipeline unit 78 should receive only data/events that are intended for the pipeline unit, the validation manager 134 may also cause the input-data handler 120 to send to the host processor 42 (FIG. 5B) an exception message that identifies the exception (erroneously received data/event) and the peer that caused the exception.

The output-data handler 126 retrieves processed data from locations of the DPSRAM 102 pointed to by the output-data queue 128, and sends the processed data to one or more peers, such as the host processor 42 (FIG. 5B), via the industry-standard bus adapter 118. The output-data handler 126 includes an interface 136, which reads the processed data from the DPSRAM 102 via the port 112. The interface 136 is further discussed below in conjunction with FIG. 7. The output-data handler 126 also retrieves from the output-event queue 130 events generated by the pipelines $74_1$-$74_n$, and sends the retrieved events to one or more peers, such as the host processor 42 (FIG. 5B) via the industry-standard bus adapter 118.

Furthermore, the output-data handler 126 includes a subscription manager 138, which includes a list of peers, such as the host processor 42 (FIG. 5B), that subscribe to the processed data and to the events; the output-data handler uses this list to send the data/events to the correct peers. If a peer prefers the data/event to be the payload of a message, then the output-data handler 126 retrieves the network or bus-port address of the peer from the subscription manager 138, generates a header that includes the address, and generates the message from the data/event and the header.

Although the technique for storing and retrieving data stored in the DPSRAMS 100 and 102 involves the use of pointers and data identifiers, one may modify the input- and output-data handlers 120 and 126 to implement other data-management techniques. Conventional examples of such data-management techniques include pointers using keys or tokens, input/output control (IOC) block, and spooling.

The communication shell 84 includes a physical layer that interfaces the hardwired pipelines $74_1$-$74_n$ to the output-data queue 128, the controller 86, and the DPSRAMs 100, 102, and 104. The shell 84 includes interfaces 140 and 142, and optional interfaces 144 and 146. The interfaces 140 and 146 may be similar to the interface 136; the interface 140 reads input data from the DPSRAM 100 via the port 108, and the interface 146 reads intermediate data from the DPSRAM 104 via the port 116. The interfaces 142 and 144 may be similar to the interface 132; the interface 142 writes processed data to the DPSRAM 102 via the port 110, and the interface 144 writes intermediate data to the DPSRAM 104 via the port 114.

The controller 86 includes a sequence manager 148 and a synchronization interface 150, which receives one or more synchronization signals SYNC. A peer, such as the host processor 42 (FIG. 5B), or a device (not shown) external to the peer-vector machine 40 (FIG. 5B) may generate the SYNC signal, which triggers the sequence manager 148 to activate the hardwired pipelines $74_1$-$74_n$ as discussed below. The synchronization interface 150 may also generate a SYNC signal to trigger the pipeline circuit 80 or to trigger another peer. In addition, the events from the input-event queue 124 also trigger the sequence manager 148 to activate the hardwired pipelines $74_1$-$74_n$ as discussed below.

The sequence manager 148 sequences the hardwired pipelines $74_1$-$74_n$ through their respective operations via the communication shell 84. Typically, each pipeline 74 has at least three operating states: preprocessing, processing, and post processing. During preprocessing, the pipeline 74, e.g., initializes its registers and retrieves input data from the DPSRAM 100. During processing, the pipeline 74, e.g., operates on the retrieved data, temporarily stores intermediate data in the DPSRAM 104, retrieves the intermediate data from the DPSRAM 104, and operates on the intermediate data to generate result data. During post processing, the pipeline 74, e.g., loads the result data into the DPSRAM 102. Therefore, the sequence manager 148 monitors the operation of the pipelines $74_1$-$74_n$ and instructs each pipeline when to begin each of its operating states. And one may distribute the pipeline tasks among the operating states differently than described above. For example, the pipeline 74 may retrieve input data from the DPSRAM 100 during the processing state instead of during the preprocessing state.

Furthermore, the sequence manager 148 maintains an internal operating synchronization among the hardwired pipelines $74_1$-$74_n$. For example, to avoid all of the pipelines $74_1$-$74_n$ simultaneously retrieving data from the DPSRAM 100, it may be desired to synchronize the pipelines such that while the first pipeline $74_1$ is in a preprocessing state, the second pipeline $74_2$ is in a processing state and the third pipeline $74_3$ is in a post-processing state. Because a state of one pipeline 74 may require a different number of clock cycles than a concurrently performed state of another pipeline, the pipelines $74_1$-$74_n$ may lose synchronization if allowed to run freely. Consequently, at certain times there may be a "bottle neck," as, for example, multiple pipelines 74 simultaneously attempt to retrieve data from the DPSRAM 100. To prevent the loss of synchronization and its undesirable consequences, the sequence manager 148 allows all of the pipelines 74 to complete a current operating state before allowing any of the pipelines to proceed to a next operating state. Therefore, the time that the sequence manager 148 allots for a current operating state is long enough to allow the slowest pipeline 74 to complete that state. Alternatively, circuitry (not shown) for maintaining an operating synchronization among the hardwired pipelines $74_1$-$74_n$ may be included within the pipelines themselves.

In addition to sequencing and internally synchronizing the hardwired pipelines $74_1$-$74_n$, the sequence manager 148 synchronizes the operation of the pipelines to the operation of other peers, such as the host processor 42 (FIG. 5B), and to the operation of other external devices in response to one or more SYNC signals or to an event in the input-events queue 124.

Typically, a SYNC signal triggers a time-critical function but requires significant hardware resources; comparatively, an event typically triggers a non-time-critical function but requires significantly fewer hardware resources. Because a SYNC signal is routed directly from peer to peer, it can trigger a function more quickly than an event, which must make its way through, e.g., the pipeline bus 50 (FIG. 5B), the input-data handler 120, and the input-event queue 124. But because they are separately routed, the SYNC signals require dedicated circuitry, such as routing lines, buffers, and the SYNC interface 150, of the pipeline circuit 80. Conversely, because they use the existing data-transfer infrastructure (e.g. the pipeline bus 50 and the input-data handler 120), the events require only the dedicated input-event queue 124. Consequently, designers tend to use events to trigger all but the most time-critical functions.

Edge Factory Techniques

Figure 8:
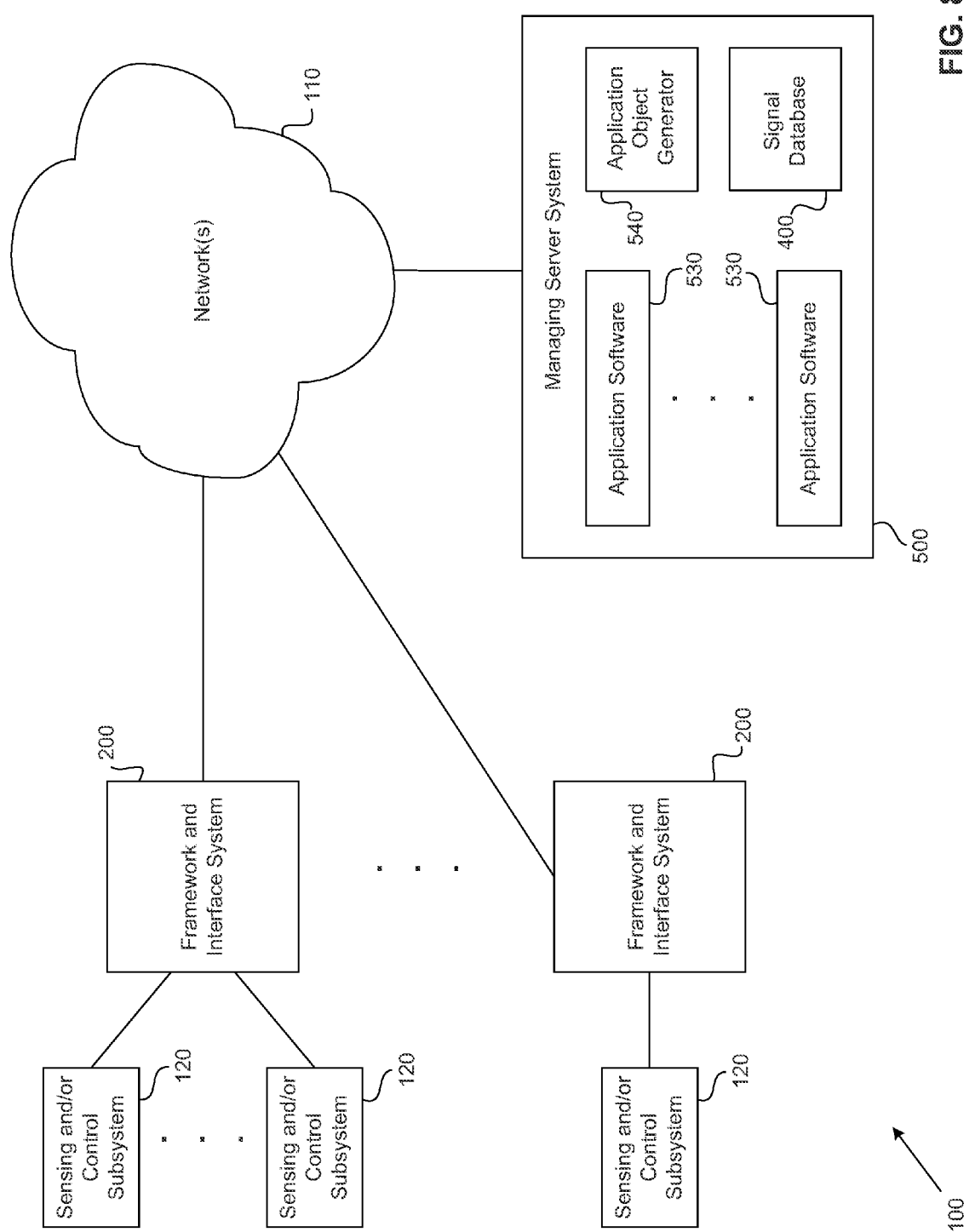
FIG. 8 is a block diagram of an object oriented framework architecture for sensing and/or control environments organized in accordance with an embodiment.

The edge factory techniques previously mentioned will now be described in more detail with reference to FIGS. 8-11. FIG. 8 is a block diagram of an object oriented sensing and/or control framework architecture 100 according to an embodiment. In one embodiment, the object oriented sensing and/or control framework architecture 100 comprises a managing server system 500 in which an application software program 530 (also referred to herein simply as application software) and other software elements 540 may reside; at least one signal database 400 associated with the managing server system 500; at least one framework and interface system 200 having a set of sensing and/or control subsystems 120 associated therewith; and a computer network 110.

The managing server system 500 may be coupled to one or more framework and interface systems 200 via the computer network 110, which may comprise one or more networks of essentially any type, including the Internet, a Wide Area Network (WAN), and/or a Local Area Network (LAN). Those skilled in the art will understand that the computer network 110 may comprise various types of network elements organized to support and/or communicate in accordance with one or more network and/or information transport protocols. In an alternate embodiment, the managing server system 500 may be directly coupled to one or more framework and interface systems 200 in a manner that omits or bypasses the computer network 110.

In one embodiment, any given framework and interface system 200 is coupled to a corresponding sensing and/or control subsystem 120. A sensing and/or control subsystem 120 may comprise various types of sensing and/or control elements directed toward signal acquisition and/or distribution within a particular environment. Such signals may be analog, digital, serial, or of other types, in accordance with the communication formats and/or protocols supported by the sensing and/or control elements to which they correspond. Sensing and/or control subsystem elements may include wire-based, wireless, electro-optic, fiber optic, and/or optical components, in a manner readily understood by those skilled in the art. Sensing elements may include, for example, switches, temperature sensors, pressure sensors, vibration sensors, position or attitude sensors, motion sensors, accelerometers, microphones or hydrophones, and feedback from various types of actuators. Control elements may include lights (e.g., lamps and/or LED's), digital or analog meters, thermostats, hydraulic controls, motor controls, engine controls, transducers, loudspeakers, alarm indicators, stepping motors, and various types of actuators. Examples of signal types that may cross boundaries between the framework and interface system 200 and a sensing and/or control subsystem 120 are shown in Table 1.

TABLE 1

Exemplary Signal Types Supported

| Sensed Signal Type | Controlled Signal Type |
|---|---|
| Synchro (Rotating Power) | Synchro (Rotating Power) |
| Low Voltage Analog | Low Voltage Analog |
| High Voltage Analog | High Voltage Analog |
| Low Current Analog | Low Current Analog |
| High Current Analog | High Current Analog |
| Optically Isolated Interrupt | Optically Isolated Interrupt |
| Low Voltage Discrete Digital | Low Voltage Discrete Digital |
| 5 Volt (TTL Level) Discrete Digital | 5 Volt (TTL Level) Discrete Digital |
| High Voltage Discrete Digital | High Voltage Discrete Digital |
| IEEE 422, 232 | IEEE 422, 232 |
| ARINC 429, 568, 582 | ARINC 429, 568, 582 |
| MIL 1553B, 1553A | MIL 1553B, 1553A |
| | Relay (Switched Signal or Power) |

Table 1. Exemplary Signal Types Supported

In one embodiment, any given sensing and/or control subsystem 120 and/or particular sensing and/or control elements therein may be monitored, managed, and/or controlled by one or more application software programs 530 executing within the managing server system 500. Communication between sensing and/or control subsystems 120 and the managing server system 500 occurs through a framework and interface system 200, as described in detail below.

The managing server system 500 itself may comprise a computer having one or more of the following as required: a processing unit, a set of input devices, a display device, a data storage unit, a network interface unit, and a memory, in a manner readily understood by those skilled in the art. Within the managing server's memory, an operating system may manage access to various hardware and/or software resources in a manner readily understood by those skilled in the art. Those skilled in the art will further understand that the operating system may be a real-time or non-real-time operating system, in accordance with temporal demands associated with any given sensing and/or control environment.

Application software 530 may comprise program instructions that reside within the managing server's memory and/or upon a data storage unit. Typically, a particular application software program 530 is associated with a specific sensing and/or control environment. The network-based access to the managing server system 500 provided by embodiments may facilitate monitoring and/or management of multiple sensing and/or control environments by one or multiple application programs 530. Those skilled in the art will understand that an alternate embodiment may include multiple managing server systems 500, which may facilitate, for example, fail-safe or high-reliability sensing and/or control operations.

In prior sensing and/or control architectures, communication processes between sensing and/or control elements and monitoring and/or control software are inflexibly bound in accordance with a particular hardware configuration. In stark contrast, embodiments provides a self-configuring hardware abstraction layer that generalizes and manages hardware-software communication processes to greatly reduce the extent to which application software 530 is dependent upon hardware configuration details. In one embodiment, a framework and interface system 200, in conjunction with a signal database 400, serves as a configuration and communication interface between one or more sensing and/or control subsystems 120 and application software 530 to provide the aforementioned abstraction layer as described in detail hereafter.

Figure 9:
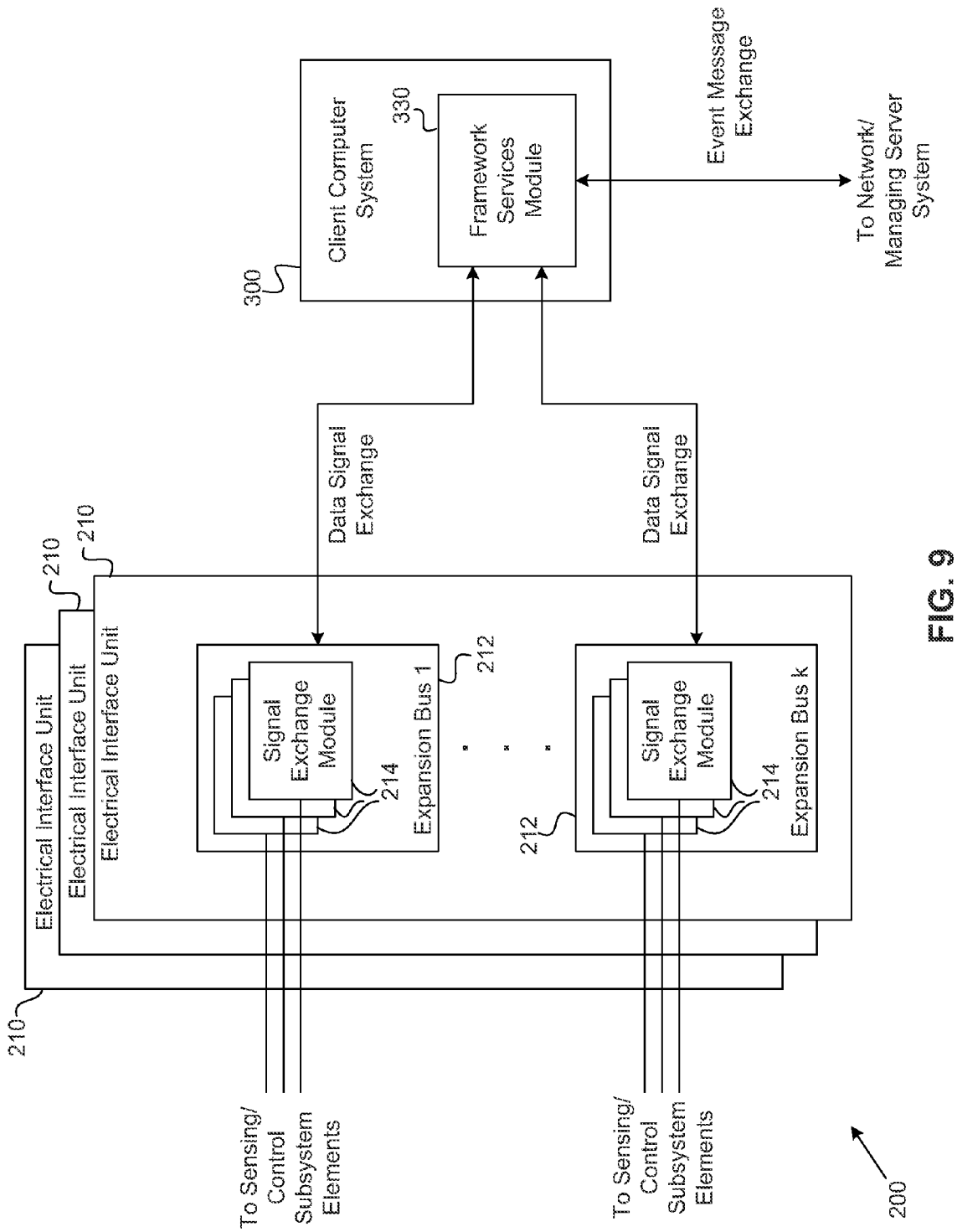
FIG. 9 is a block diagram of a framework and interface system according to an embodiment.

FIG. 9 is a block diagram of a framework and interface system 200 according to an embodiment. The framework and interface system 200 may comprise a set of electrical interface units 210, and a client computer system 300 having a framework services module 330 therein. Each electrical interface unit 210 may be coupled to a sensing and/or control subsystem 120 as well as the client computer system 300, which may further be coupled to the managing server system 500.

The client computer system 300 may comprise a computer having a processing unit, a set of input devices, a display device, a data storage unit, a network interface unit, and a memory, in a manner readily understood by those skilled in the art. An operating system residing within the memory may manage access to various hardware and/or software resources within the client computer system 300, in a manner readily understood by those skilled in the art. Those skilled in the art will additionally recognize that the operating system may be a real-time or non-real-time operating system in accordance with temporal processing requirements associated with any given sensing and/or control subsystem 120. The framework services module 330 may comprise program instructions that reside within memory and/or upon the data storage unit, and which provide functionality described in detail below.

In one embodiment, an electrical interface unit 210 comprises one or more expansion buses 212 and a set of signal exchange modules 214 coupled thereto. Signal exchange modules 214 may reside upon expansion bus or mezzanine bus cards, which plug into an expansion bus 212 in a conventional manner. Any given expansion bus card upon which a signal exchange module 214 resides may itself reside upon a carrier board. A carrier board may reside within a rack, which may reside within an enclosure, in a manner readily understood by those skilled in the art. Alternatively or additionally, one or more portions of a given electrical interface unit 210 may reside within the client computer system 300.

Any given signal exchange module 214 may correspond to a set of sensing and/or control subsystem elements, and may comprise circuitry for exchanging analog and/or digital signals therewith. A signal exchange module 214 may include analog-to-digital (A/D) and/or digital-to-analog (D/A) conversion circuitry, signal conditioning and/or processing circuitry, interrupt management circuitry, and/or one or more registers or data storage elements, in a manner readily understood by those skilled in the art. A signal exchange module 214 may further include a Programmable Read Only Memory (PROM) that stores information identifying and/or describing the signal exchange module 214 and its supported modes of operation. A signal exchange module 214 may be implemented, for example, using an Industry Pack (IP) module, in a manner readily understood by those skilled in the art.

An expansion bus 212 provides a set of datapaths that facilitate communication between one or more signal exchange modules 214 and the client computer system 300. An expansion bus 212 may comprise essentially any type of bus implemented in accordance with known bus architecture definitions, such as a VersaModular Eurocard (VME) bus or a Peripheral Components Interconnect (PCI) bus.

A signal exchange module 214 may receive an electrical signal from a sensing and/or control subsystem element, perform any required signal conditioning, format conversion, and/or local processing thereupon, and store one or more corresponding hardware signals or data signals in a register, storage element, or memory. An expansion bus 212 to which the signal exchange module 214 is coupled may facilitate transfer of such data signals to or retrieval of such data signals by the client computer system 300. Similarly, the client computer system 300 may transfer one or more data signals to a signal exchange module 214, which may perform any required signal conversion operations thereupon and/or deliver a corresponding electrical signal to a sensing and/or control subsystem element.

Within the client computer system 300, the framework services module 330 manages information exchange between application software 530 and signal exchange modules 214. Communication between the framework services module 330 and signal exchange modules 214 comprises the exchange of hardware signals or data signals. Any given data signal may directly correspond to a particular signal exchange module 214. Moreover, the manner in which any given data signal is exchanged may depend upon the manner in which its associated signal exchange module 214 is implemented.

In contrast, communication between the framework services module 330 and application software 530 comprises the exchange of events. In the context of the embodiments, an event corresponds to a condition or occurrence having meaning or relevance to application software 530 for the purpose of monitoring or managing a sensing and/or control subsystem 120. In one embodiment, an event comprises an event identifier and a set of data values associated therewith. As described in detail below, embodiments associates event identifiers with data signals in a flexible manner. The use of event identifiers advantageously disassociates application software 530 from signal exchange module configuration and communication details.

Figure 10:
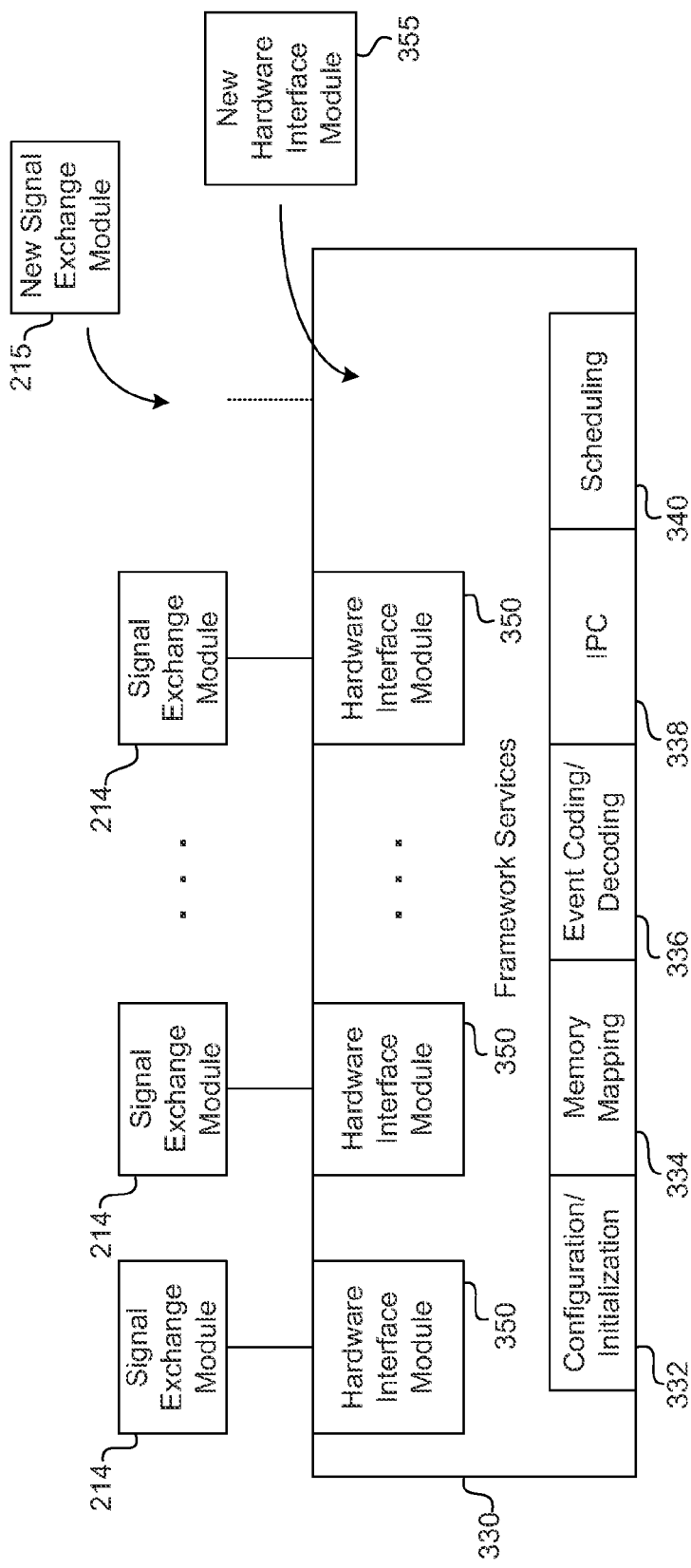
FIG. 10 is a functional block diagram of a framework services module 330 and a manner of interfacing to signal exchange module hardware according to an embodiment.

FIG. 10 is a functional block diagram of a framework services module 330 and a manner of interfacing to signal exchange module hardware according to an embodiment. In one embodiment, the framework services module 330 comprises an object oriented software framework having a configuration and initialization module 332; a memory mapping module 334; an event coding/decoding module 336; an interprocess communication (IPC) module 338; and a scheduling module 338, each of which provides a core type of framework services module functionality as further described below. The framework services module 330 may additionally comprise one or more hardware interface modules 350 that communicate with corresponding signal exchange modules 214. As described in detail below, the configuration and initialization module 332 may automatically generate a hardware interface module 350 in a manner that flexibly accommodates or accounts for hardware dependencies, thereby providing the framework services module 330 with extensible functionality.

The configuration and initialization module 332 may operate during an initialization mode to retrieve from the signal database 400 configuration information describing one or more signal exchange modules 214 within an electrical interface unit 210 to which the framework services module 300 is coupled. The configuration and initialization module 332 may build or generate a hardware interface module 350 for communicating with a signal exchange module 214 using the retrieved configuration information.

In particular, upon retrieving such information associated with a given signal exchange module 214, the configuration and initialization module 332 may initiate or invoke a set of executable files for generating one or more portions of a hardware interface module 350, passing as parameters to such executable files particular configuration information retrieved from the signal database 400. Such parameters may comprise a) one or more location identifiers that uniquely specify where the signal exchange module 214 physically and/or logically resides; b) a communication interface definition for the signal exchange module 214, which may include a port number, one or more interrupt definitions, and/or storage element identifications and/or descriptions; c) data signal definitions for each data signal that the signal exchange module 214 may exchange; d) an event identifier, such as a number and/or character, associated with each such data signal; and/or e) other information, such as a manufacturer name and model number.

FIG. 11 is a set of signal database objects or tables 402, 404, 406, 408 that specifies exemplary configuration information for a signal exchange module 214 implemented as an IP module. In general, the signal database 400 comprises objects or structures that define a hardware/software boundary. Such objects or structures may include parameters or attributes describing or elaborating upon characteristics of each signal exchange module 214. Such parameters may specify how the signal exchange module 214 may be accessed to exchange particular data signals corresponding thereto, and mappings between such data signals and event identifiers.

Particular parameter values within any given signal database object or table 402, 404, 406, 408 may be determined automatically, for example, by retrieval of information specified in one or more hardware description files. In one embodiment, the signal database 400 may reside within a data storage unit associated with the managing server system 500. One or more portions of the signal database 400 may reside elsewhere in an alternate embodiment, such as upon the client computer system 300 or within a Network Attached Storage (NAS) device, in a manner readily understood by those skilled in the art.

Referring again to FIGS. 8-10, the memory mapping module 334 may map a register and/or a memory address space associated with each signal exchange module 214 to addresses within the client computer system's memory, such that signal exchange module storage locations appear as local addresses to the framework services module 330. The event coding/decoding module 336 may encode data signals received from signal exchange modules 214 into corresponding events directed to application software 530 during system operation. The event coding/decoding module 336 may further transform events received from application software 530 into data signals directed to appropriate signal exchange modules 214, after which one or more hardware interface modules 350 may deliver such data signals thereto to effectuate subsystem control. In one embodiment, an event comprises an event identifier and one or more data values representing the data signal that corresponds to the event identifier.

The IPC module 338 may manage communication between the framework services module 330 and application software 530. In one embodiment, the IPC module 338 transmits events to and receives events from application software 530 during system operation. The scheduling module 340 may oversee or perform periodic or aperiodic data collection operations within the framework services module 300 to facilitate communication with application software 530.

Each data signal output by any given signal exchange module 214 may be associated with an event identifier within the signal database 400. Application software 530 is responsive to the receipt of an event rather than direct receipt of a data signal. Upon receipt of an event, the application software 530 may respond by taking an action corresponding to the event, and/or generating another event and returning it to the framework services module 300. The underlying hardware in any given electrical interface unit 210 is thus transparent to the application software 530. In other words, an application program 530 does not require knowledge of which or which type of signal exchange module 214 led to the generation of an event, but need only take appropriate action in response to receipt of such an event. For example, if an operator in a cockpit simulation system moves a switch into an ON position, this may be encoded as event number five. Relative to application software 530, identification of which signal exchange module 214 detected the movement of the switch into the ON position may be unimportant or unnecessary.

The architecture 100 of embodiments thus eliminates the dependency between application software 530 and signal exchange module hardware configuration. The application software 530 need not be modified each time the configuration of signal exchange modules 214 changes, thereby eliminating time consuming application software recompilation, testing, and debugging procedures. For example, a new signal exchange module 215 may be plugged into an electrical interface unit 210 and the signal database 400 may be updated to describe the new signal exchange module 215 in a manner analogous to that detailed above in FIG. 11. In particular, signal database objects 402, 404, 406, 408 corresponding to the new signal exchange module 215 may be created or instantiated as part of a signal database update procedure. The configuration and initialization module 332 may subsequently execute an initialization or update routine, retrieving information from the signal database 400 and generating a new hardware interface module 355 for communicating with the new signal exchange module 215. The architecture 100 of embodiments further provides for hardware debugging and error correction without application software modification in an analogous manner.

The architecture 100 of embodiments may significantly reduce the labor required to provide sensing and/or control system documentation and a translation of a hardware layout into a software design. The signal database 400 includes the needed interface documentation for defining hardware/software boundaries. As engineers analyze external hardware circuitry, the hardware design may be captured in the signal database 400. Software boundary documentation may be provided by a printout of signal database contents.

Typically, software engineers rely upon software boundary documentation to generate code specific to a hardware design. In contrast, the managing server system 500 may include an application object generator 540 that automatically generates objects or code for processing events based upon and/or in accordance with a hardware design captured in the signal database 400. Embodiments thereby may significantly reduce the time and cost associated with application software development. Those skilled in the art will understand that an application object generator 540 need not reside and/or execute upon or within the managing server system 500, but may reside and/or execute upon another computer system having access to the signal database 400.

The architecture 100 of embodiments may be applied to essentially any type of local or distributed sensing and/or control environment. Additionally, the architecture 100 described herein may be readily scaled. Embodiments may include multiple framework and interface systems 200, where signal exchange modules 214 associated therewith are described in a signal database 400. Additionally, because the architecture 100 of embodiments may be network-based and/or internet-based, such embodiments may readily facilitate communication between application software 530 and sensing and/or control subsystems 120 located in various parts of the world.

Examples of sensing and/or control environments to which the architecture 100 described herein may be applied include the following: a facility-wide oil refinery control system; a facility-wide electrical power plant control system; a distributed flight simulation training suite having a cockpit simulator in one location for pilots, and a cabin simulator in another location for crew members; an integrated naval ship simulation system, including propulsion, navigation, radar, acoustics, and/or fire control subsystems; an integrated merchant ship simulation system, including propulsion, navigation, radar, and/or cargo hold control and sensing subsystems; and a coastal defense system that includes multiple underwater hydrophone subsystems.

From the foregoing it will be appreciated that, although specific embodiments have been described herein for purposes of illustration, various modifications may be made without deviating from the spirit and scope of the disclosure.

What is claimed is:

1. A mission system comprising:
a peer vector framework including a peer vector machine having a host processor and pipeline accelerator and operable to communicate via message objects;
a remote sensing and control framework operable to communicate via signal objects;
a mission framework operable to communicate via mission objects; and
blackboard bridges that are operable to provide communication between and among the peer vector framework, remote sensing and control framework, and mission framework;
wherein the remote sensing and control framework comprises:
a sensor operable to sense a physical parameter and generate an electrical signal responsive to the sensed physical parameter; and
a pipeline accelerator having local processing circuitry physically positioned proximate to the sensor and electrically coupled to the sensor, the local processing circuitry including an output port adapted to be coupled to a communications channel and operable to process a first data set from the sensor to generate a second data set and to provide the second data set to a communicatively coupled host processor via the communications channel and output port, said second data set derived from said first data set and having a size less than the first data set such that the second data set is operable to be transmitted through a low-bandwidth channel in less time than the first data set.

2. The mission system of claim 1 wherein the local processing circuitry applies the second data set on the output port according to a bandwidth-enhancement communications protocol.

3. The mission system of claim 1 wherein the second data set comprises a message including a header portion indicating a destination of the message and a payload portion.

4. The mission system of claim 1 wherein the local processing circuitry comprises a peer vector machine.

5. The mission system of claim 1 wherein the pipeline accelerator is formed in a field programmable gate array (FPGA).

6. The mission system of claim 5 wherein the pipeline accelerator further comprises:
a memory; and
a hardwired-pipeline circuit coupled to the memory and operable to,
receive the first data set from the sensor;
load the first data set into the memory;
retrieve the first data set from the memory;
process the retrieved first data set to generate the second data set; and
provide the second data set to a host processor coupled to the hardwired-pipeline circuit via the communications channel and output port.

7. The mission system of claim 1 wherein the pipeline accelerator includes an input port and wherein the sensor is coupled to the input port.

8. The mission system of claim 7 further comprising a plurality of sensors and a plurality of hardwired-pipeline circuits, each hardwired-pipeline circuit being coupled to a respective sensor.

9. The mission system of claim 1 wherein the sensor is coupled to the local processing circuitry through the communications channel.

* * * * *